(12) United States Patent
Finkelstein

(10) Patent No.: US 11,689,397 B2
(45) Date of Patent: *Jun. 27, 2023

(54) SYSTEMS AND METHODS FOR EXTENDED SPECTRUM CABLE NETWORK

(71) Applicant: Cox Communications, Inc., Atlanta, GA (US)

(72) Inventor: Jeffrey L. Finkelstein, Atlanta, GA (US)

(73) Assignee: COX COMMUNICATIONS, INC., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,312

(22) Filed: Mar. 30, 2022

(65) Prior Publication Data

US 2022/0224573 A1 Jul. 14, 2022

Related U.S. Application Data

(63) Continuation of application No. 16/268,341, filed on Feb. 5, 2019, now Pat. No. 11,296,911.

(51) Int. Cl.
| | |
|---|---|
| *H04L 25/14* | (2006.01) |
| *H04L 5/00* | (2006.01) |
| *H03M 13/13* | (2006.01) |
| *H04L 12/28* | (2006.01) |
| *H04L 12/64* | (2006.01) |
| *H04L 25/08* | (2006.01) |

(52) U.S. Cl.
CPC ............ *H04L 25/14* (2013.01); *H03M 13/13* (2013.01); *H04L 5/0007* (2013.01); *H04L 12/2801* (2013.01); *H04L 12/6418* (2013.01); *H04L 25/08* (2013.01); *H04L 2012/6421* (2013.01)

(58) Field of Classification Search
CPC ... H04L 5/0007; H04L 12/2801; H04L 25/14; H04L 25/08; H04L 12/6418; H04L 2012/6421; H04L 25/03878; H03M 13/13; H03M 13/1102
See application file for complete search history.

(56) References Cited

U.S. PATENT DOCUMENTS

| | | | | |
|---|---|---|---|---|
| 8,340,613 | B1 * | 12/2012 | Magnusen | H03D 3/00 |
| | | | | 455/67.11 |
| 11,296,911 | B2 * | 4/2022 | Finkelstein | H04L 12/2801 |
| 2006/0085727 | A1 * | 4/2006 | Azenkot | H04L 27/34 |
| | | | | 714/792 |

(Continued)

*Primary Examiner* — Mandish K Randhawa
(74) *Attorney, Agent, or Firm* — Eversheds-Sutherland (US) LLP

(57) ABSTRACT

In various embodiment, the disclosed systems, methods, and apparatuses describe extending the usage spectrum for cable networks (e.g., hybrid fiber-coaxial networks). In particular, embodiments of the disclosure described determining a first portion of a signal having a first frequency band, the first frequency band being greater than approximately 1.2 GHz; determining a second portion of the signal having a second frequency band, the second frequency band being less than or equal to approximately 1.2 GHz; applying an attenuation to the first portion of the signal; and transmitting the second portion of the signal at a flat power-spectral density. Various other related systems, methods, and apparatuses are described.

20 Claims, 10 Drawing Sheets

(56) References Cited

U.S. PATENT DOCUMENTS

| | | | |
|---|---|---|---|
| 2016/0197678 A1* | 7/2016 | Zheng | H01S 5/06251 |
| | | | 398/183 |
| 2018/0234275 A1* | 8/2018 | Miller | H04B 3/02 |
| 2019/0140741 A1* | 5/2019 | Cheng | H04W 72/044 |
| 2019/0326950 A1* | 10/2019 | Jin | H04B 3/238 |
| 2019/0372818 A1* | 12/2019 | Williams | H04L 27/04 |

* cited by examiner

SYSTEMS AND METHODS FOR EXTENDED SPECTRUM CABLE NETWORK

CROSS-REFERENCE TO RELATED PATENT APPLICATION(S)

This application is a continuation of and claims the benefit of U.S. Non-Provisional application Ser. No. 16/268,341, filed Feb. 5, 2019, the disclosures of which are incorporated by reference as set forth in full.

BACKGROUND

A variety of service providers, such as cable providers and satellite providers, may connect user devices to one or more networks, such as cable networks and/or the Internet. A provider may provide cable and/or Internet access to a residence via devices such as headends which may include a computer system and/or database required for provisioning of content. The headend may include cable modem termination system (CMTS), which can send and receive cable modem signals on a cable network to provide Internet services to cable subscribers. However, the residence may experience issues such as congestion, speed losses, pricing spikes, service interruptions, and the like that can degrade the user experience. Accordingly, there is a strong need in the market for systems and methods that remedy such problems and challenges.

BRIEF DESCRIPTION OF THE DRAWINGS

Figure 1:
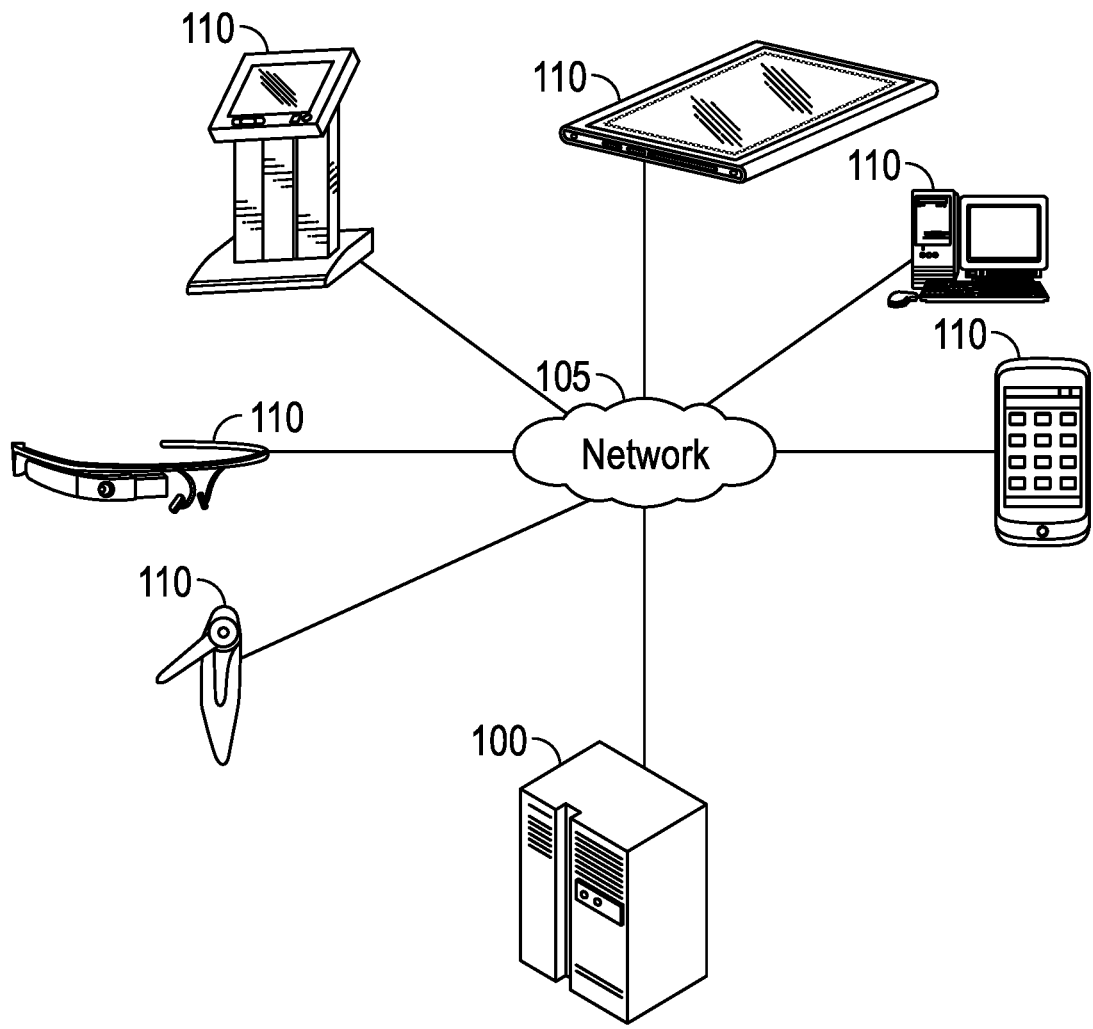

Having thus described the disclosure in general terms, reference will now be made to the accompanying drawings, which may not necessarily be drawn to scale, and wherein:

FIG. 1 is an overview of a system that can be used to practice example embodiments of the present disclosure.

Figure 2:
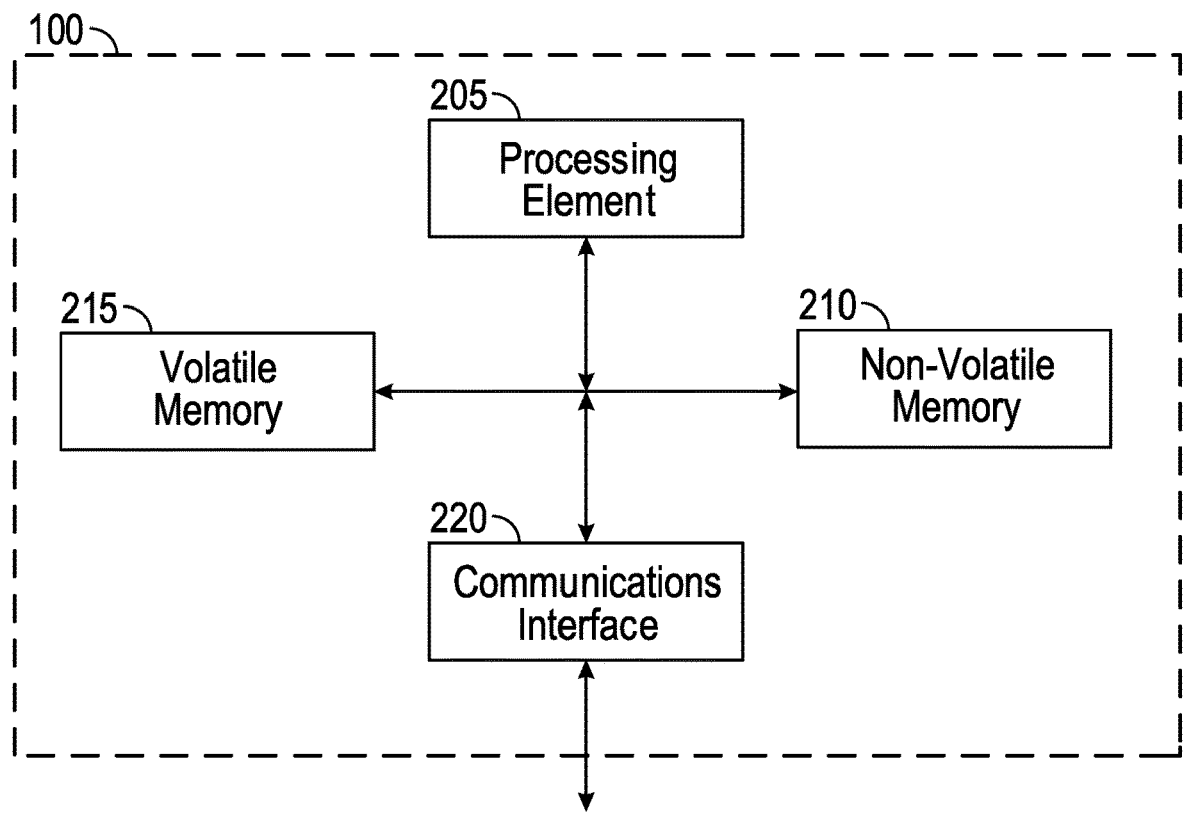

FIG. 2 is an example schematic diagram of a management computing entity, in accordance with example embodiments of the disclosure.

Figure 3:
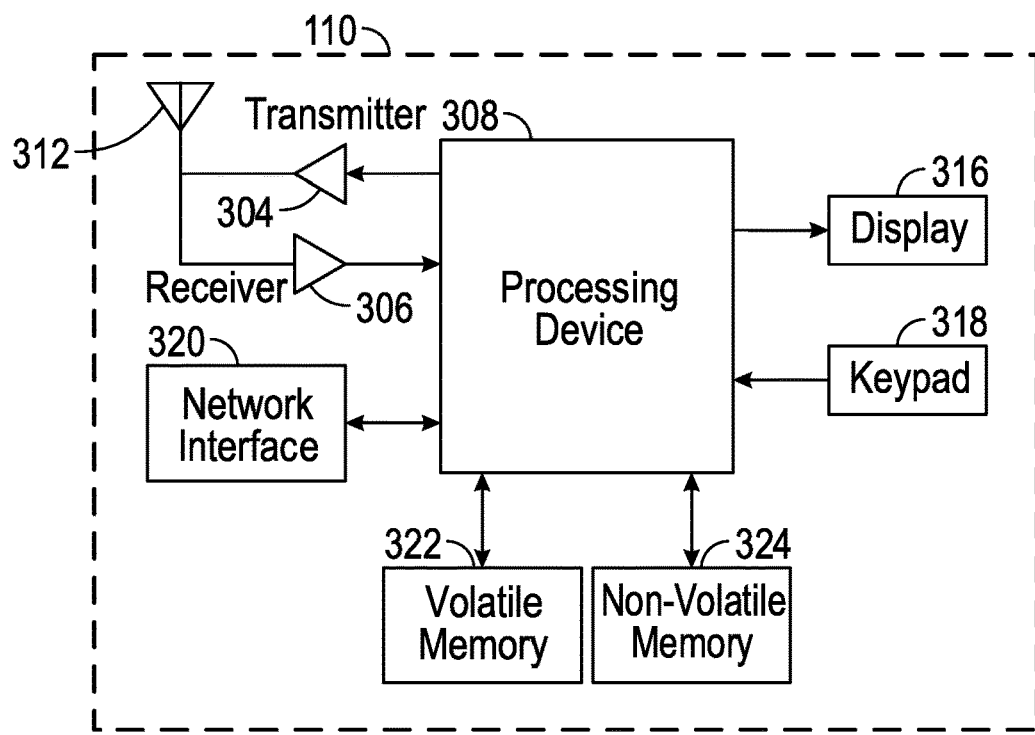

FIG. 3 is an example schematic diagram of a user device, in accordance with example embodiments of the disclosure.

Figure 4:
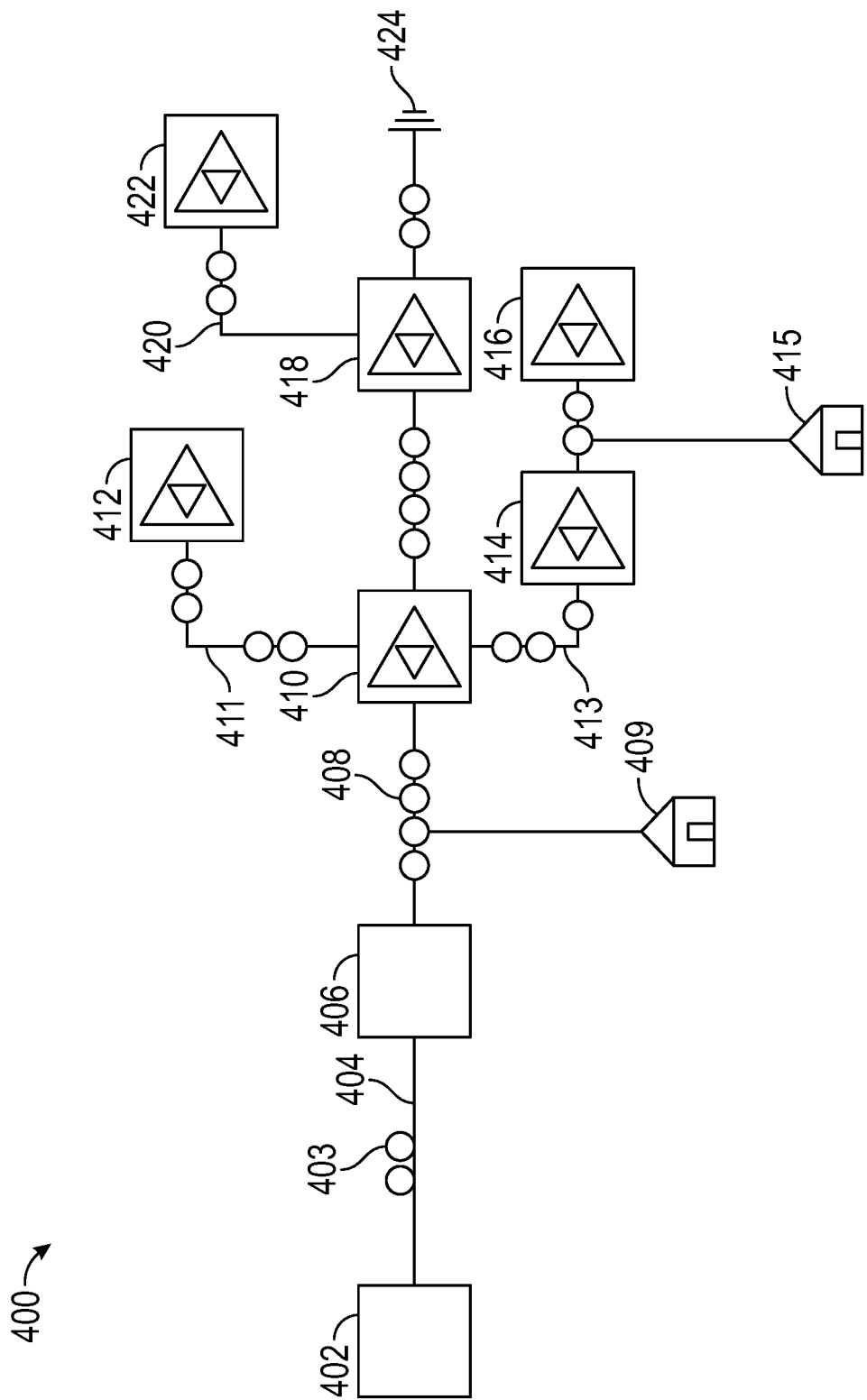

FIG. 4 shows an example schematic diagram of a portion of a cable network and associated devices, in accordance with example embodiments of the disclosure.

Figure 5:
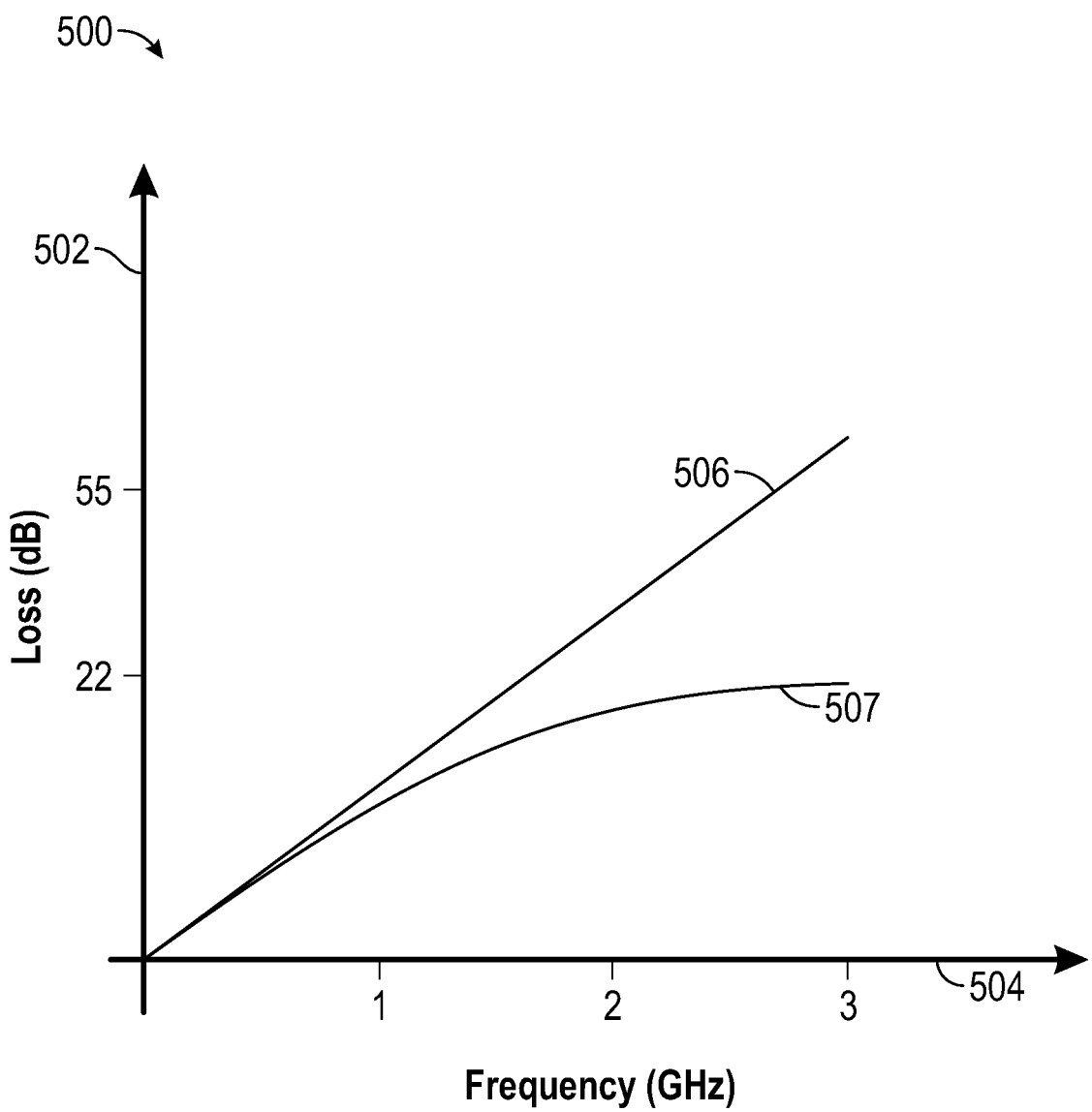

FIG. 5 shows an example diagram representing a plot of the loss in a cable network versus operational frequency, in accordance with example embodiments of the disclosure.

Figure 6:
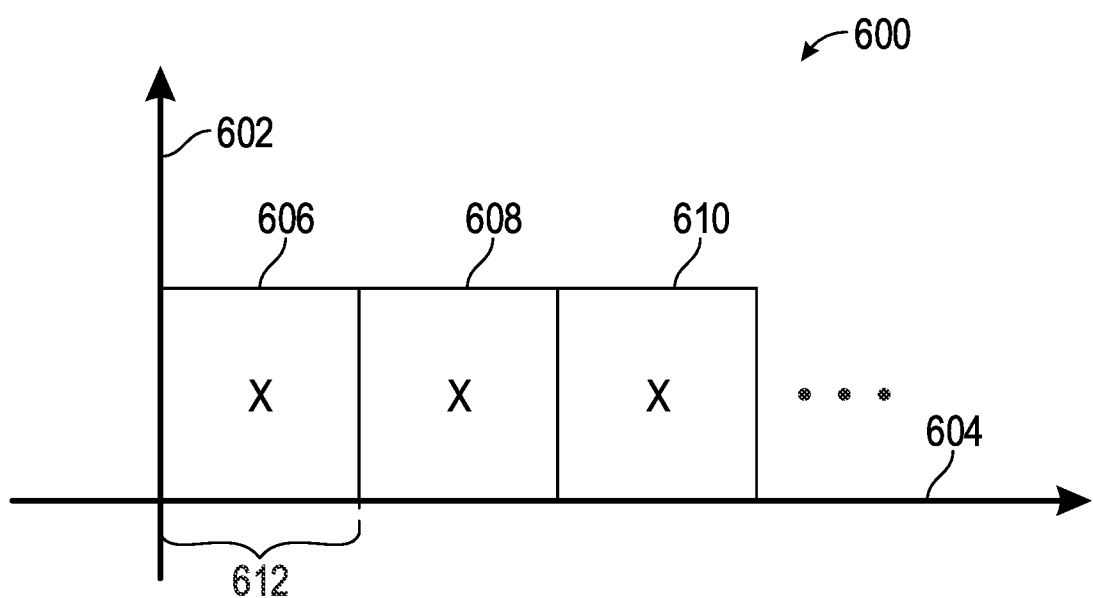

FIG. 6 shows an example schematic diagram of a plot of power spectral density (PSD) of subcarriers used in transmissions by devices over a network, in accordance with example embodiments of the disclosure.

Figure 7:
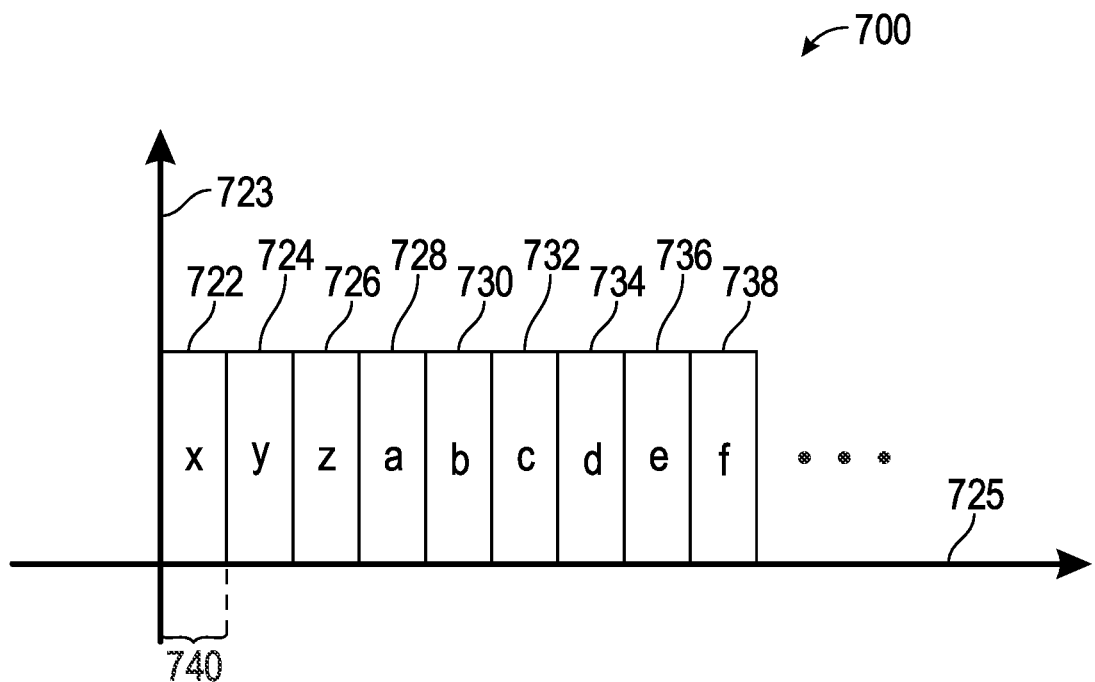

FIG. 7 shows another example schematic diagram of a plot of the PSD of subcarriers used in transmissions by devices over the network, in accordance with example embodiments of the disclosure.

Figure 8:
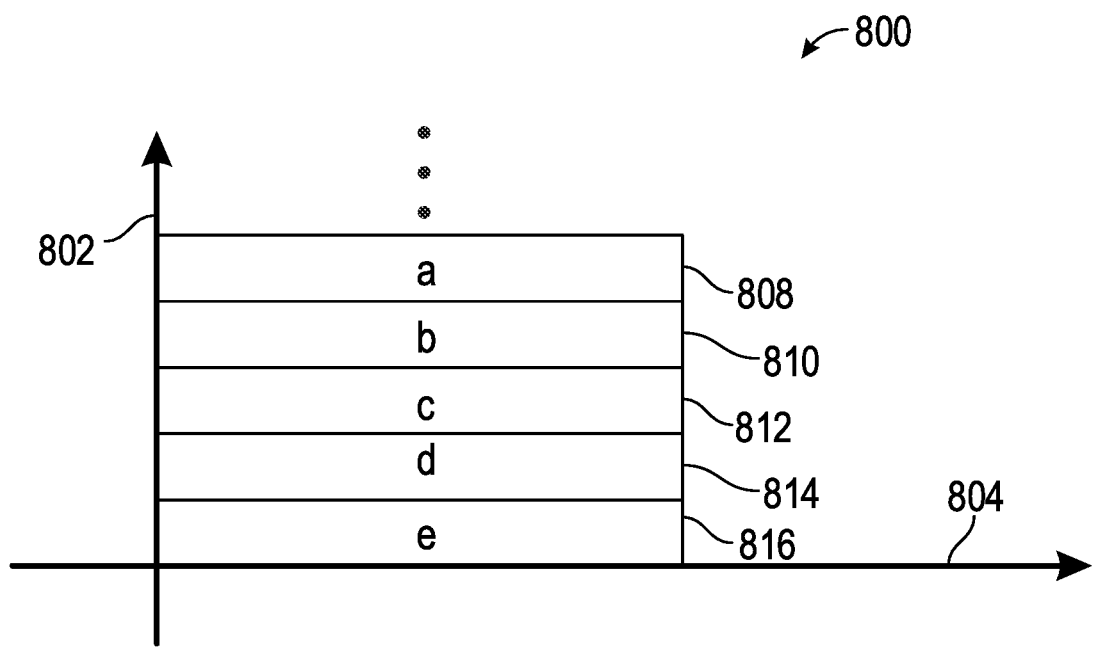

FIG. 8 shows an example schematic diagram of a plot of power versus time or frequency for transmissions over a network by devices using non-orthogonal multiple access (NOMA), in accordance with example embodiments of the disclosure.

Figure 9:
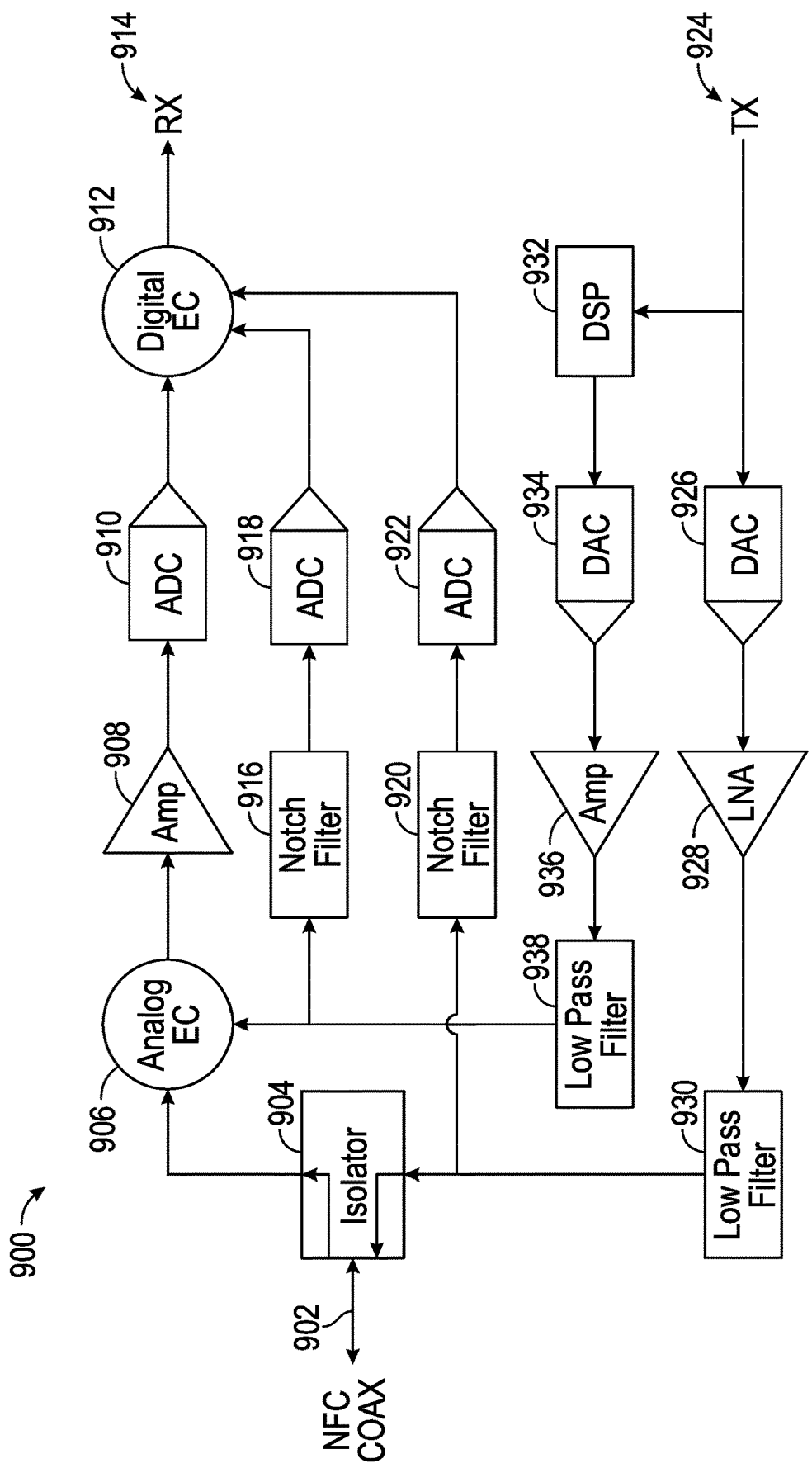

FIG. 9 shows an example schematic diagram of an echo cancellation circuit, in accordance with example embodiments of the disclosure.

Figure 10:
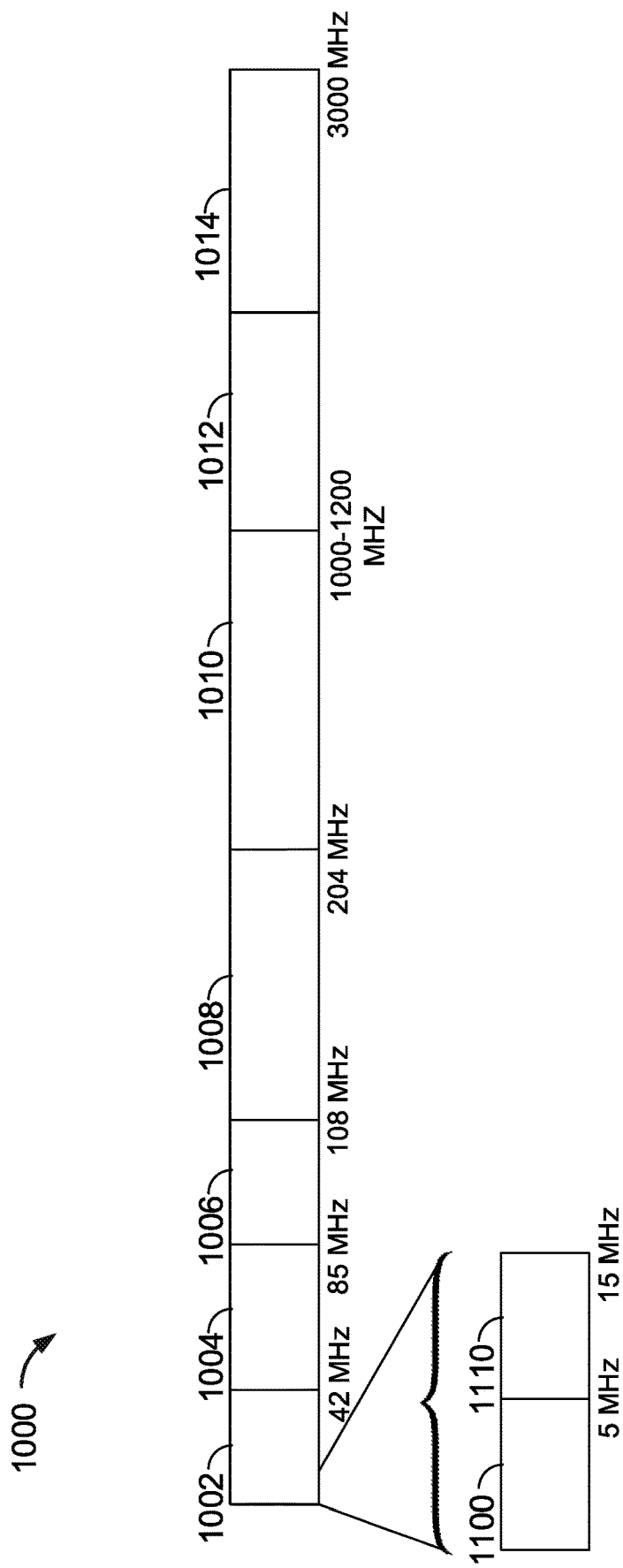

FIG. 10 shows a diagram representing a spectrum usage for devices on a cable network, in accordance with example embodiments of the disclosure.

Figure 11:
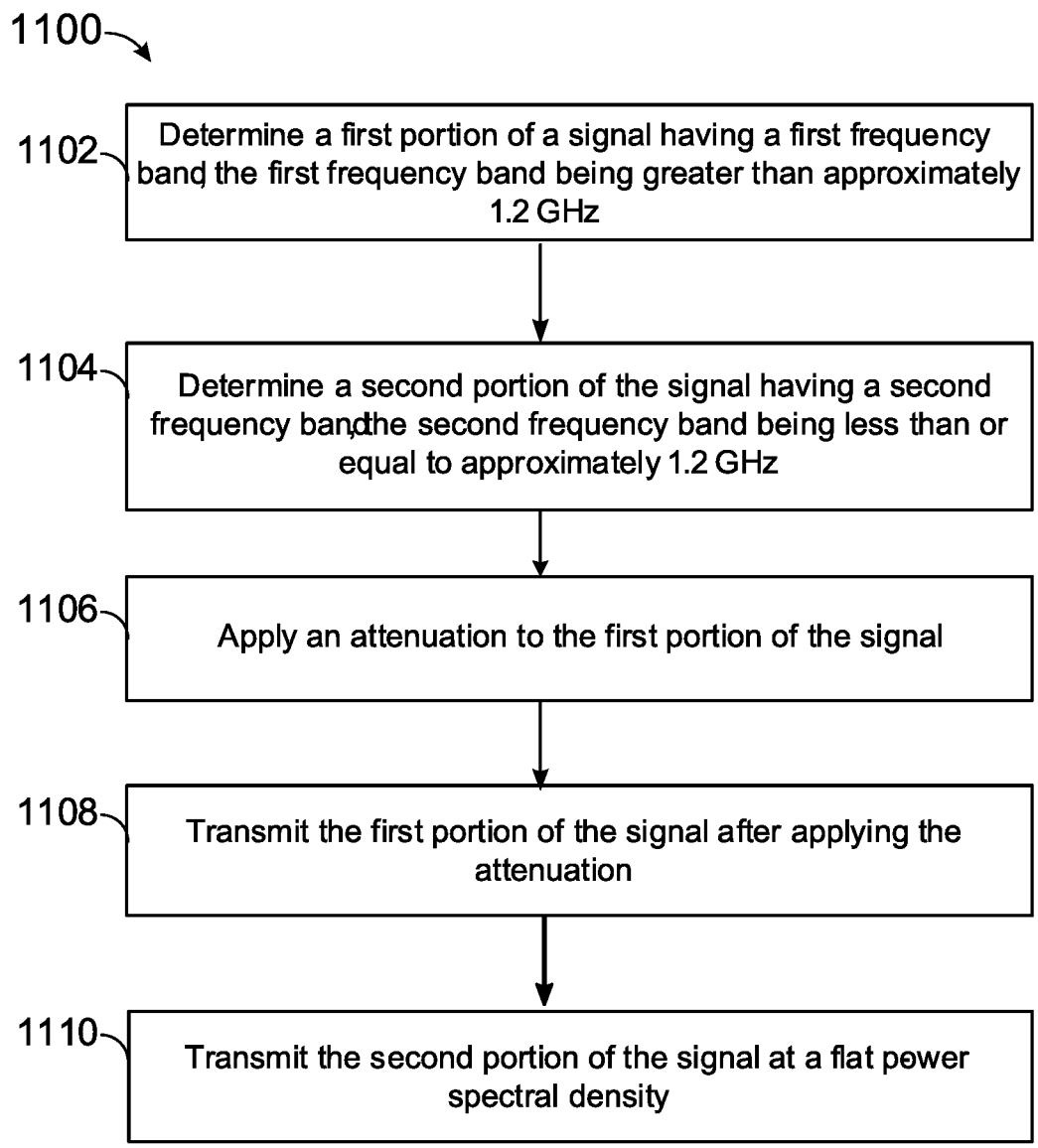

FIG. 11 shows a flow chart illustrating example operations that may be performed by one or more devices described in connection with the disclosed system, in accordance with various embodiments of the disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF VARIOUS EMBODIMENTS

In various embodiments, described herein include systems, methods, and apparatuses for extending the spectrum of operation of a network (e.g., a wired network such as a hybrid fiber-coaxial, HFC, network). In particular, embodiments of the disclosure are directed to determining a first portion of a signal having a first frequency band, the first frequency band being greater than approximately 1.2 GHz; determining a second portion of the signal having a second frequency band, the second frequency band being less than or equal to approximately 1.2 GHz; causing to apply an attenuation to the first portion of the signal; and causing to transmit the second portion of the signal at a flat power-spectral density.

Other embodiments of this aspect include corresponding systems, apparatuses, and computer programs, configured to perform the actions of the methods, encoded on computer storage devices.

Particular embodiments of the subject matter described herein can be implemented so as to realize one or more of the following advantages. Improve network stability and operational data transfer rates and, in turn, improve the user experience. Reduce the costs associated with routing network traffic, network maintenance, network upgrades, and/or the like.

The details of one or more embodiments of the subject matter described herein are set forth in the accompanying drawings and the description below. Other features, aspects, and advantages of the subject matter will become apparent from the description, the drawings, and the claims.

Various embodiments of the present disclosure now will be described more fully hereinafter with reference to the accompanying drawings, in which some, but not all embodiments are shown. Indeed, the disclosure may be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. The terms "illustrative" and "example" are used to be examples with no indication of quality level. Like numbers refer to like elements throughout. Arrows in each of the figures depict bi-directional data flow and/or bi-directional data flow capabilities. The terms "path," "pathway" and "route" are used interchangeably herein.

Embodiments of the present disclosure may be implemented in various ways, including as computer program products that comprise articles of manufacture. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, computer program products, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (for example a solid state drive (SSD)), solid state card (SSC), solid state module (SSM), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (for example Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (Fe-RAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present disclosure may also be implemented as methods, apparatuses, systems, computing devices, computing entities, and/or the like. As such, embodiments of the present disclosure may take the form of an apparatus, system, computing device, computing entity, and/or the like executing instructions stored on a computer-readable storage medium to perform certain steps or operations. Thus, embodiments of the present disclosure may also take the form of an entirely hardware embodiment, an entirely computer program product embodiment, and/or an embodiment that comprises combination of computer program products and hardware performing certain steps or operations.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatuses, systems, computing devices, computing entities, and/or the like carrying out instructions, operations, steps, and similar words used interchangeably (for example the executable instructions, instructions for execution, program code, and/or the like) on a computer-readable storage medium for execution. For example, retrieval, loading, and execution of code may be performed sequentially such that one instruction is retrieved, loaded, and executed at a time. In some example embodiments, retrieval, loading, and/or execution may be performed in parallel such that multiple instructions are retrieved, loaded, and/or executed together. Thus, such embodiments can produce specifically configured machines performing the steps or operations specified in the block diagrams and flowchart illustrations. Accordingly, the block diagrams and flowchart illustrations support various combinations of embodiments for performing the specified instructions, operations, or steps.

FIG. 1 provides an illustration of an example embodiment of the present disclosure. As shown in FIG. 1, this particular embodiment may include one or more management computing entities 100, one or more networks 105, and one or more user devices 110. Each of these components, entities, devices, systems, and similar words used herein interchangeably may be in direct or indirect communication with, for example, one another over the same or different wired or wireless networks. Additionally, while FIG. 1 illustrates the various system entities as separate, standalone entities, the various embodiments are not limited to this particular architecture.

In various aspects, the management computing entities 100 may include various devices or portions of devices on a cable network, including, but not limited to, cable modems, optical nodes, switches, medium access control (MAC) devices, physical layer (PHY) devices, amplifiers, fiber nodes, access points (APs), and the like, variously described below. In another embodiment, such devices may include circuitry (e.g., processors and memory) and associated software instructions (e.g., computer code) to perform various functions associated with such devices (e.g., determine signals for transmission, modulate signals in accordance with one or more modulation techniques, transmit signals including packets, receive including packets, process including packets, schedule including packets, etc.). Moreover, such management computing entities 100 may perform aspects of the transmission of data over networks in accordance with various protocols as described herein (e.g., at least with respect to FIGS. 4-12, below).

In another embodiment, the networks 105 may include, but not be limited to, cable networks including hybrid fiber-coaxial networks. More broadly, the networks 105 may include at least portions of wireless networks or wired networks. In another embodiment, a cable network may use various sub-networks (e.g., WiFi networks, cellular networks) to perform aspects of the functionality described herein, for example, in connection with the disclosed devices (e.g., switches, MAC devices, cable modem termination system (CMTS) devices, PHY devices, amplifiers, optical fiber nodes, access points, and the like). In another embodiment, the networks 105 may use at least a portion of a fifth-generation cellular mobile communications, also referred to as 5G herein.

In another embodiment, the user devices 110 may include, but not be limited to, devices associated with a customer premise equipment (e.g., devices located in the home of a user or on the person of a user). Non-limiting examples may include, but not be limited to, one or more computers, computing entities, desktop computers, mobile phones, tablets, phablets, notebooks, laptops, distributed systems, gaming consoles (for example Xbox, Play Station, Wii), watches, glasses, iBeacons, proximity beacons, key fobs, radio frequency identification (RFID) tags, ear pieces, scanners, televisions, dongles, cameras, wristbands, wearable items/devices, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein.

FIG. 2 provides a schematic of a management computing entity 100 according to one embodiment of the present disclosure. As noted above, a management computing entity 100 may include various devices on a cable network, including, but not limited to, switches, MAC devices, access point devices, PHY devices, amplifiers, fiber nodes, and the like.

Further, the management computing entity 100 may include a content component, a processing component, and a transmitting component (not shown). In particular, the content component may serve to determine signals indicative of data (e.g., video, audio, text, data, combinations thereof, and/or the like) to be transmitted over the network. In another embodiment, the determination of the signal for transmission may be, for example, based on a user input to the device, a predetermined schedule of data transmissions on the network, changes in network conditions, and the like. In one embodiment, the signal may include that data may be encapsulated in a data frame that is configured to be sent from a device to one or more devices on the network.

In another embodiment, the processing component may serve to determine various parameters associated with the signal for transmission over the network. For example, the processing component may serve to determine various parameters for the signal a modulation scheme (e.g., a particular quadrature amplitude modulation (QAM) modulation, to be discussed further below), a power level (e.g., a particular orthogonal frequency division multiplexing (OFDM) and/or non-orthogonal multiple access (NOMA) power level and/or code scheme), a frequency band (e.g., an approximately 1 GHz to approximately 3 GHz frequency band or any portion thereof), header information associated with the signal, combinations thereof, and/or the like.

In one embodiment, the transmitting component (not shown) may serve to transmit the signal from one device to another device on the network. For example, the transmitting component may serve to prepare a transmitter (e.g., transmitter 304 of FIG. 3, below) to transmit the signal over the network. For example, the transmitting component may queue the signal in one or more buffers, may ascertain that the transmitting device and associated transmitters are functional and have adequate power to transmit the signal over the network, may adjust one or more parameters (e.g., modulation type, signal amplification, signal power level, noise rejection, combinations thereof, and/or the like) associated with the transmission of the signal.

In general, the terms computing entity, computer, entity, device, system, and/or similar words used herein interchangeably may refer to, for example, one or more computers, computing entities, desktop computers, mobile phones, tablets, phablets, notebooks, laptops, distributed systems, gaming consoles (for example Xbox, Play Station, Wii), watches, glasses, iBeacons, proximity beacons, key fobs, radio frequency identification (RFID) tags, ear pieces, scanners, televisions, dongles, cameras, wristbands, wearable items/devices, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein interchangeably. In one embodiment, these functions, operations, and/or processes can be performed on data, content, information, and/or similar terms used herein interchangeably.

As indicated, in one embodiment, the management computing entity 100 may also include one or more communications interfaces 220 for communicating with various computing entities, such as by communicating data, content, information, and/or similar terms used herein interchangeably that can be transmitted, received, operated on, processed, displayed, stored, and/or the like. For instance, the management computing entity 100 may communicate with user devices 110 and/or a variety of other computing entities.

As shown in FIG. 2, in one embodiment, the management computing entity 100 may include or be in communication with one or more processing elements 205 (also referred to as processors, processing circuitry, and/or similar terms used herein interchangeably) that communicate with other elements within the management computing entity 100 via a bus, for example. As will be understood, the processing element 205 may be embodied in a number of different ways. For example, the processing element 205 may be embodied as one or more complex programmable logic devices (CPLDs), microprocessors, multi-core processors, coprocessing entities, application-specific instruction-set processors (ASIPs), microcontrollers, and/or controllers. Further, the processing element 205 may be embodied as one or more other processing devices or circuitry. The term circuitry may refer to an entirely hardware embodiment or a combination of hardware and computer program products. Thus, the processing element 205 may be embodied as integrated circuits, application specific integrated circuits (ASICs), field programmable gate arrays (FPGAs), programmable logic arrays (PLAs), hardware accelerators, other circuitry, and/or the like. As will therefore be understood, the processing element 205 may be configured for a particular use or configured to execute instructions stored in volatile or non-volatile media or otherwise accessible to the processing element 205. As such, whether configured by hardware or computer program products, or by a combination thereof, the processing element 205 may be capable of performing steps or operations according to embodiments of the present disclosure when configured accordingly.

In one embodiment, the management computing entity 100 may further include or be in communication with non-volatile media (also referred to as non-volatile storage, memory, memory storage, memory circuitry and/or similar terms used herein interchangeably). In one embodiment, the non-volatile storage or memory may include one or more non-volatile storage or memory media 210, including but not limited to hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. As will be recognized, the non-volatile storage or memory media may store databases, database instances, database management systems, data, applications, programs, program modules, scripts, source code, object code, byte code, compiled code, interpreted code, machine code, executable instructions, and/or the like. The term database, database instance, database management system, and/or similar terms used herein interchangeably may refer to a collection of records or data that is stored in a computer-readable storage medium using one or more database models, such as a hierarchical database model, network model, relational model, entity-relationship model, object model, document model, semantic model, graph model, and/or the like.

In one embodiment, the management computing entity 100 may further include or be in communication with volatile media (also referred to as volatile storage, memory, memory storage, memory circuitry and/or similar terms used herein interchangeably). In one embodiment, the volatile storage or memory may also include one or more volatile storage or memory media 215, including but not limited to RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, the processing element 205. Thus, the databases, database instances, database management systems, data, applications, programs, program modules, scripts, source code, object code, byte code, compiled code, interpreted code, machine code, executable instructions, and/or the like may be used to control certain aspects of the operation of the management computing entity 100 with the assistance of the processing element 205 and operating system.

As indicated, in one embodiment, the management computing entity 100 may also include one or more communications interfaces 220 for communicating with various computing entities, such as by communicating data, content, information, and/or similar terms used herein interchangeably that can be transmitted, received, operated on, processed, displayed, stored, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the management computing entity 100 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Zigbee, Bluetooth protocols, wireless universal serial bus (USB) protocols, and/or any other wireless protocol.

Although not shown, the management computing entity 100 may include or be in communication with one or more input elements, such as a keyboard input, a mouse input, a touch screen/display input, motion input, movement input, audio input, pointing device input, joystick input, keypad input, and/or the like. The management computing entity 100 may also include or be in communication with one or more output elements (not shown), such as audio output, video output, screen/display output, motion output, movement output, and/or the like.

As will be appreciated, one or more of the management computing entity's 100 components may be located remotely from other management computing entity 100 components, such as in a distributed system. Furthermore, one or more of the components may be combined and additional components performing functions described herein may be included in the management computing entity 100. Thus, the management computing entity 100 can be adapted to accommodate a variety of needs and circumstances. As will be recognized, these architectures and descriptions are provided for example purposes only and are not limiting to the various embodiments.

A user may be an individual, a family, a company, an organization, an entity, a department within an organization, a representative of an organization and/or person, and/or the like. In one example, users may be employees, residents, customers, and/or the like. For instance, a user may operate a user device 110 that includes one or more components that are functionally similar to those of the management computing entity 100. In some embodiments, user devices 110 may include, but not be limited to, devices associated with a customer premise equipment, as described above. In another embodiment, the user device 110 may be configured to receive data from an access point, or other similar device (e.g., at a customer premise equipment site such as a home).

In various aspects, the processing component, the transmitting component, and/or the receiving component (not shown) may be configured to operate on one or more devices (e.g., device 402 to be shown and described in connection with FIG. 4, below, which may include a CMTS, another network controller device further upstream on the network, and/or other devices further downstream on the network) may include aspects of the functionality of the management computing entity 100, as shown and described in connection with FIGS. 1-2 here. In particular, the processing component, the transmitting component, and/or the receiving component may be configured to be in communication with one or more processing elements 205, memory 210, volatile memory 215, and may include a communication interface 220 (e.g., to facilitate communication between devices, for example, with various customer premise equipment such as cable modems).

FIG. 3 provides an illustrative schematic representative of a user device 110 that can be used in conjunction with embodiments of the present disclosure. In general, the terms device, system, computing entity, entity, and/or similar words used herein interchangeably may refer to, for example, one or more computers, computing entities, desktops, mobile phones, tablets, phablets, notebooks, laptops, distributed systems, gaming consoles (for example Xbox, Play Station, Wii), watches, glasses, key fobs, radio frequency identification (RFID) tags, ear pieces, scanners, cameras, wristbands, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. User devices 110 can be operated by various parties. As shown in FIG. 3, the user device 110 can include an antenna 312, a transmitter 304 (for example radio), a receiver 306 (for example radio), and a processing element 308 (for example CPLDs, microprocessors, multi-core processors, coprocessing entities, ASIPs, microcontrollers, and/or controllers) that provides signals to and receives signals from the transmitter 304 and receiver 306, respectively.

The signals provided to and received from the transmitter 304 and the receiver 306, respectively, may include signaling information in accordance with air interface standards of applicable wireless systems. In this regard, the user device 110 may be capable of operating with one or more air interface standards, communication protocols, modulation types, and access types. More particularly, the user device 110 may operate in accordance with any of a number of wireless communication standards and protocols, such as those described above with regard to the management computing entity 100. In a particular embodiment, the user device 110 may operate in accordance with multiple wireless communication standards and protocols, such as UMTS, CDMA2000, 1×RTT, WCDMA, TD-SCDMA, LTE, E-UTRAN, EVDO, HSPA, HSDPA, Wi-Fi, Wi-Fi Direct, WiMAX, UWB, IR, NFC, Bluetooth, USB, and/or the like. Similarly, the user device 110 may operate in accordance with multiple wired communication standards and protocols, such as those described above with regard to the management computing entity 100 via a network interface 320.

Via these communication standards and protocols, the user device 110 can communicate with various other entities using concepts such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). The user device 110 can also download changes, add-ons, and updates, for instance, to its firmware, software (for example including executable instructions, applications, program modules), and operating system.

According to one embodiment, the user device 110 may include location determining aspects, devices, modules, functionalities, and/or similar words used herein interchangeably. For example, the user device 110 may include outdoor positioning aspects, such as a location module adapted to acquire, for example, latitude, longitude, altitude, geocode, course, direction, heading, speed, universal time (UTC), date, and/or various other information/data. In one embodiment, the location module can acquire data, sometimes known as ephemeris data, by identifying the number of satellites in view and the relative positions of those satellites. The satellites may be a variety of different satellites, including Low Earth Orbit (LEO) satellite systems, Department of Defense (DOD) satellite systems, the European Union Galileo positioning systems, the Chinese Compass navigation systems, Indian Regional Navigational satellite systems, and/or the like. Alternatively, the location information can be determined by triangulating the user device's 110 position in connection with a variety of other systems, including cellular towers, Wi-Fi access points, and/or the like. Similarly, the user device 110 may include indoor positioning aspects, such as a location module adapted to acquire, for example, latitude, longitude, altitude, geocode, course, direction, heading, speed, time, date, and/or various other information/data. Some of the indoor systems may use various position or location technologies including RFID tags, indoor beacons or transmitters, Wi-Fi access points, cellular towers, nearby computing devices (for example smartphones, laptops) and/or the like. For instance, such technologies may include the iBeacons, Gimbal proximity beacons, Bluetooth Low Energy (BLE) transmitters, NFC transmitters, and/or the like. These indoor positioning aspects can be used in a variety of settings to determine the location of someone or something to within inches or centimeters.

The user device 110 may also comprise a user interface (that can include a display 316 coupled to a processing element 308) and/or a user input interface (coupled to a processing element 308). For example, the user interface may be a user application, browser, user interface, and/or similar words used herein interchangeably executing on and/or accessible via the user device 110 to interact with and/or cause display of information from the management computing entity 100, as described herein. The user input interface can comprise any of a number of devices or interfaces allowing the user device 110 to receive data, such as a keypad 318 (hard or soft), a touch display, voice/speech or motion interfaces, or other input devices. In embodiments including a keypad 318, the keypad 318 can include (or cause display of) the conventional numeric (0-9) and related keys (#, *), and other keys used for operating the user device 110 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The user device 110 can also include volatile storage or memory 322 and/or non-volatile storage or memory 324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The volatile and non-volatile storage or memory can store databases, database instances, database management systems, data, applications, programs, program modules, scripts, source code, object code, byte code, compiled code, interpreted code, machine code, executable instructions, and/or the like to implement the functions of the user device 110. As indicated, this may include a user application that is resident on the entity or accessible through a browser or other user interface for communicating with the management computing entity 100 and/or various other computing entities.

In another embodiment, the user device 110 may include one or more components or functionality that are the same or similar to those of the management computing entity 100, as described in greater detail above. As will be recognized, these architectures and descriptions are provided for example purposes only and are not limiting to the various embodiments.

In various embodiments, various components and signal characteristics (e.g., the type and length of cable used, the number of splitters, the type of taps, the number of amplifiers, the quality of the signal) may influence the communications over a network, such as a hybrid fiber-coaxial (HFC) network. In various aspects, some conventional HFC networks may generally operate on a spectrum less than or equal to approximately 1.2 GHz. In particular, for communication greater than about 1.2 GHz, one or more network taps of the HFC network may need to be passive (e.g., not have any active components such as amplifiers); however, the deployment of such network taps may be limited in geographical extent (e.g., about 1000 feet). In various aspects, embodiments of the disclosure devices may enable network communication up to approximately 3 GHz or higher.

In various embodiments, for some (e.g., legacy) HFC networks, as a signal is pushed further downstream on the network through various amplifiers, the quality of the signal may be impacted (e.g., degraded). In another embodiment, the signal may need to be amplified, and various distortions to the signal may need to be corrected. In various aspects, embodiments of the disclosure are directed to the network operating at greater than about 1.2 GHz, while maintaining compatibility with transmissions below about 1.2 GHz. In another embodiment, portions of signals transmitted over such a network may be configured to have a relatively flat power spectral density (PSD) over the frequency range of operation (e.g., at or above about 1.2 GHz). In another embodiment, orthogonal frequency division multiplexing (OFDM) techniques may be used to modulate the signals transmitted over the network. In an embodiment, portions of the signals transmitted over the network may be tilted (e.g., attenuated) at frequencies less than or equal to about 1.2 GHz. In various embodiments, for signal components at frequencies less than or equal to about 1.0 GHz, an approximately 17 dB tilt may be applied. In another embodiment, for signals between about 1.0 GHz and about 1.2 GHz, an approximately 5 dB tilt may be applied in addition to a transmission of a flat PSD. In one embodiment, for signals between about 1.2 GHz and about 1.8 GHz, an approximately 7 dB tilt may be needed in addition to a transmission of a flat PSD.

In another embodiment, components of the signals transmitted over the network at various frequencies (e.g., including over 1.2 GHz) may be linearized using any suitable technique, for example, using various signal processing techniques. For example, the signal may be linearized by using linear error correcting codes such as low-density parity-check (LDPC) codes. In another embodiment, the signal may be linearized by using a given modulation technique such as OFDM and/or orthogonal frequency-division multiple access (OFDMA). In another embodiment, for duplex communication over the network, the network may operate in accordance with a given modulation technique such as non-orthogonal multiple access (NOMA). In particular, at least some frequency components of signals transmitted between devices on the network may be transmitted using a NOMA technique. In another embodiment, a portion of the signal having a spectrum between about 5 MHz to about 15 MHz may be prone to noise (e.g., noise originating from a drop and/or the plant). In another embodiment, the portion of the signal from about 5 MHz to about 15 MHz may be dropped (e.g., filtered out) from the signals transmitted over the network.

FIG. 4 shows example diagrams of another network architecture, in accordance with example embodiments of the disclosure. In one embodiment, as shown in diagram 400, device 402 can represent a headend device. In one aspect, device 402 can include converged cable access platform (CCAP) device. CCAP can refer to equipment that combines aspects of the functionality of edge QAM technology with cable model termination systems (CMTSs) to provide services such as internet and voice over IP while encoding and transmitting digital video channels over the cable network.

In one embodiment, the device 402 can be electronically connected to device 406, which can represent a network node device, for example, a network node device such as remote physical (PHY) device, remote medium access control (MAC) device, and/or remote hybrid PHY/MAC device. In one aspect, the electronic connection between device 402 and device 406 can be via a cable 404, for example, a fiber optic cable. In an embodiment, device 402 and/or 406 can encompass aspects of the functionality of the management computing entity 100, described above. In one embodiment, the device 406 can include a switch, for example, a network switch such as an Ethernet switch. In some embodiments, as shown in diagram 400, the device 406 can be electronically connected to a customer premise, for example, a home 409 (also referred to herein as a household) and various devices associated with the home 409 (e.g., mobile phones, laptops, tablet, computers, and/or the like).

In another embodiment, device 406 can be connected to different homes via a network of amplifiers, such as bidirectional amplifiers 410, 412, 414, 416, 418, and/or 422. Further, there may be additional taps (e.g., similar to tap 408) between the bidirectional amplifiers 410, 412, 414, 416, 418, and/or 422. For example, device 406 can be connected via connection 413 to the home 415 through one or more amplifiers (e.g., amplifier 410 and amplifier 414) and/or one or more taps similar to tap 408. Moreover, while only homes 409 and 415 are depicted in diagram 400, there may be additional homes (not shown) that are connected to any of the taps shown in the diagram. In some respects, the amplifiers can serve to amplify signals to restore attenuation of the signals during propagation over the network. In another embodiment, diagram 400 can represent a node-x embodiment, where node-x can represent a node having a variable number of amplifiers at a given node-split. Further, the taps and/or amplifiers may be grounded, for example, using a ground such as ground 424. There may be additional grounds associated with the various taps and/or bidirectional amplifiers depicted (not shown).

In some embodiments, the system represented by diagram 400 may include a source (not shown) which may be connected to device 402 via cables (not shown). The source may be configured to provide a downstream broadband signal to one or more customer devices and receive upstream signals from the one or more customer devices, for example, customer devices at the homes 409 and/or 415. The devices 402 and/or 406 may be configured (i) to receive the downstream broadband signal via the cables 404, (ii) convert the downstream broadband signal into a radio frequency downstream signal, (iii) output the downstream broadband signal onto one or more cable lines for communication to the one or more customer devices, (iv) receive the upstream signals via the one or more cable lines, and in some cases, (v) convert the received upstream signals into light signals for communication to the source.

In some embodiments, the source may be a suitable source of broadband content, such as a cable plant. The source may be configured to generate and/or combine any number of data streams and/or data components into a broadband signal that is output by the source for receipt by one or more households, for example, homes 409 and/or 415. For example, the source may be configured to obtain video data streams from one or more content providers, such as television networks, premium content providers, and/or other content providers, and the source may be configured to generate a broadband signal based at least in part on the video data streams. As desired, the source may insert commercials and/or other data into a television or video component of a broadband signal. Additionally, the source may be configured to generate or obtain any number of data components that are inserted or added to a broadband signal, such as television guide data, an Internet data signal, home security data signals, voice over internet protocol (VoIP) telephone signals, etc. Any number of modulation techniques and/or data standards may be utilized by a source in the generation or compilation of a broadband data signal. For example, television data may be modulated utilizing a suitable QAM or other modulation technique, and the modulated data may be incorporated into the broadband data signal. As another example, an orthogonal frequency-division multiple access (OFDMA) technique, a time division multiple access (TDMA) technique, an advanced time division multiple access (ATDMA) technique, a synchronous code division multiple access (SCDMA) technique, a non-orthogonal multiple access (NOMA) modulation technique (to be discussed further below), or another suitable modulation technique or scheme may be utilized to modulate data included within the broadband data signal. The broadband data signal may be configured to provide a wide variety of services to one or more households, including but not limited to, television service, telephone service, Internet service, home monitoring service, security service, etc.

In certain embodiments, the generated broadband signal may be output utilizing one or more cables 404, for example, fiber optic cables or optical fibers that are configured to carry the broadband signal from the source to one or more corresponding devices, for example, device 402 and device 406. For example, the radio frequency broadband signal may be processed utilizing one or more suitable wavelength-division multiplexing (WDM) devices 403 or WDM systems, and the processed signal may be provided to or driven onto an optical fiber. A wide variety of different types of WDM devices 403 may be utilized as desired in various embodiments of the disclosure, such as dense WDM devices and add-drop WDM devices. As desired, a WDM device 403 may include a terminal multiplexer component that includes one or more wavelength converting transponders. Each wavelength converting transponder may receive one or more components of the input broadband signal and convert that signal into a light signal using a suitable laser, such as a 1550 nm band laser. The terminal multiplex may also contain an optical multiplexer configured to receive the various 1550 nm band signals and place or drive those signals onto a single optical fiber.

As desired, the WDM device 403 may amplify the broadband signals that are processed by the WDM device. Additionally or alternatively, one or more line repeaters or other amplifying devices (such as amplifiers) may be positioned along a length of the optical fiber 404 in order to amplify the broadband signal and compensate for any losses in optical power.

In addition to processing downstream or forward path signals that are received from the source, the WDM device 403 may be configured to receive and process upstream signals that are communicated to the source from the households, for example, from homes 409 and/or 415. Cables, for example cable 404 (which can include, for example, optical fibers) may be configured to carry broadband signals between the source and/or the devices 402 and/or 406, and/or to and from various customer equipment via the taps (e.g., taps 408). These signals may include forward path signals generated by the source and return path signals generated by one or more households. A wide variety of different optical fibers may be utilized as desired in various embodiments of the disclosure, such as multi-mode fibers, single-mode fibers, and special purpose fibers. Additionally, the optical fibers may be constructed from a wide variety of different materials, such as silica, fluorides, phosphates, and/or chalcogenides. The optical fibers may be configured to carry signals as light pulses utilizing total internal reflection.

Moreover, any number of devices similar to device 406, which can alternatively or additionally be referred to as fiber nodes may be provided. Each fiber node may be configured to receive and process downstream or forward path signals from the source. Additionally, each fiber node may be configured to receive and process upstream or return path signals received from the one or more households.

In some embodiments, once a signal has been filtered out or otherwise isolated by the bidirectional amplifiers (e.g., bidirectional amplifiers 410, 412, 414, 416, 418, and/or 422), the bidirectional amplifiers may amplify the signal. For example, the bidirectional amplifiers may increase the amplitude of the signal. In certain embodiments, the various components of a broadband signal (e.g., low return path, forward path, high return path) may be amplified by respective amplification components of the amplifiers. Each amplified signal may then be output onto or driven back onto the cable line in a desired direction for the signal. As desired, any number of diodes or other suitable devices may be incorporated into the bidirectional amplifiers in order to prevent or limit undesired leakage of an amplified signal in a direction from which the signal was received. For example, the bidirectional amplifiers may receive a return path signal from a terminator (not shown) or other amplifier, the bidirectional amplifiers may amplify the signal, and the bidirectional amplifier may output the signal in an upstream direction towards devices 402 and/or 406 and/or source while limiting the output or leakage of the signal in a downstream direction.

The bidirectional amplifiers (e.g., bidirectional amplifiers 410, 412, 414, 416, 418, and/or 422), may include a wide variety of gains as desired in various embodiments of the disclosure. Additionally, as desired, different gains may be utilized for different components of a broadband signal. In certain embodiments, the bidirectional amplifiers may be powered by a received broadband signal, such as a received downstream signal. Additionally or alternatively, the bidirectional amplifiers may be powered by one or more batteries and/or external power sources. In certain embodiments, the power requirements of the bidirectional amplifiers may be based at least in part on the modulation technique(s) utilized in association with the broadband signals that are amplified. In one example embodiment, a relatively low power amplifier may be provided in association with an OFDM modulation technique.

Any number of taps (e.g., similar to tap 408) may be connected to a given cable line. A tap may form an access point from which one or more households, such as home 409, may be provided with broadband services. Any number of households may be serviced by a given tap 408 as desired in various embodiments of the disclosure. For example, in certain embodiments, up to four households may be serviced by a tap. As desired, a cable drop or other signal line (e.g., a coaxial cable or RF cable) may extend from the tap to the household. In this regard, signals may be provided to and/or received from the household.

In an embodiment, the signals transmitted between the CTMS and various customer premise equipment (e.g., cable modems) at the households and/or between devices (e.g., between devices 402 and 406) can be purified via echo cancellation both in the analog and digital domain. In another embodiment, an analog echo canceller can reduce the echoes of the signal in the analog domain. In an embodiment the analog echo canceller can reduce the echo, group delay, noise amplitude, and the like, of the signal. Further description of the echo canceller will be provided below. The signal can, alternatively or additionally, proceed to an analog-to-digital converter (ADC) for conversion to the digital domain. In an embodiment, the signal can proceed thereafter to a digital echo canceller, which can remove echoes and the like in the digital domain. In an embodiment, the output of the digital echo canceler can be transmitted from the CMTS to a device, for example, a cable modem.

In some embodiments, the cable network as described above can include a regional or area headend/hub. The hub can receive programming that is encoded, modulated and upconverted onto radio frequency (RF) carriers, combined onto a single electrical signal and inserted into a broadband transmitter, for example, an optical transmitter. In some embodiments, the transmitter can convert the electrical signal to a downstream modulated signal that is sent to the nodes. Fiber optic cables connect the headend or hub to nodes in various topologies, including, but not limited to, point-to-point or star topologies, ring topologies, and the like.

By using the various techniques described herein, in addition to frequency-division multiplexing and/or the NOMA-based techniques as also described herein, an HFC network such as the one described in connection with FIG. 4 may carry a variety of services, for example, analog and digital TV, video on demand, telephony, data, and the like, and may be configured to perform at frequency ranges exceeding about 1.2 GHz (e.g., up to at least 3 GHz). Services on these systems can be carried on radio frequency (RF) signals in particular regions of the available spectrum.

In one embodiment, the HFC network described above can be operated bi-directionally such that signals are carried in both directions on the same network. For example, the signals can be transmitted from the headend/hub office to the customer, and from the customer to the headend/hub office. In one aspect, a forward-path or downstream signals can refer to information from the headend/hub office to the customer. In another embodiment, a return-path or upstream signals can refer to information from the customer to the headend/hub office. The forward-path and the return-path can be carried over the same coaxial cable in both directions between the node and the customer equipment. In some embodiments, HFC network can be structured to be asymmetrical, that is, data transmission in the downstream direction has much more data-carrying capacity than the upstream direction.

In various aspects, the devices 402 and 406 may include aspects of the functionality of the management computing entity 100, as shown and described in connection with FIGS. 1-2, above. In particular, the devices 402 and 406 may include or be in communication with one or more processing elements 205, memory 210, volatile memory 215, and may include a communication interface 220 (e.g., to communicate with between each other and with various customer premise equipment such as cable modems).

Moreover, the customer premise equipment devices at the household may include devices that include aspects of the functionality of the user device 110, as further shown and described in connection with FIG. 3, above. For example, customer premise equipment devices may include a transmitter 304, a receiver 306, and/or a network interface (e.g., to communicate with an access point or other device to receive information from the devices 402 and 406). Moreover, the customer premise equipment devices may include volatile memory 322 and/or non-volatile memory 324 in addition to a processor (e.g., to perform one or more computational tasks, such as processing received signals, etc.). Further, the customer premise equipment devices may include a display 316 and/or a keypad 318 (e.g., for interacting with a user or operator).

In various embodiments, for some (e.g., legacy) HFC networks, there may be about five to six amplifiers associated with a given tap, and a tap may feed about four homes. Moreover, as noted, as a signal is pushed further downstream on the network through the amplifiers, the quality of the signal may be impacted (e.g., degraded). In another embodiment, the signal may need to be amplified, and various distortions to the signal may need to be corrected. In some embodiments, networks may not implement amplifiers in the network; however, this option may be cost prohibitive.

In various aspects, as noted, embodiments of the disclosure are directed to the network operating at greater than about 1.2 GHz (e.g., up to at least 3 GHz). In another embodiment, a signal transmitted over such a network may be configured to have a relatively flat PSD over at least a portion of the frequency range of operation (e.g., portions corresponding to frequencies at or above about 1.2 GHz). In one embodiment, OFDM techniques may be used to modulate the signals transmitted over the network. In an embodiment, portions of the signals corresponding to frequencies less than or equal to about 1.2 GHz may be tilted (e.g., attenuated) for transmission over the network. Further, for signals components above about 1.2 GHz, the signal components may be transmitted over the network with a relatively flat PSD. In another embodiment, for signal components having a frequency greater than about 1 GHz, the signal components may not need to be tilted.

In some embodiments, a tilt compensator device may be used to attenuate the lower frequency components of the transmitted signals on the network. In various embodiments, the tilt compensator device may be used to counter various signal distortions generated by amplifiers in combination with long stretches of cable (e.g., coaxial cable). In some embodiments, amplifiers may amplify lower frequency signal components more than higher frequency signal components. This, in combination with long cable runs, may cause the signal strength to be unbalanced in low and high channels. Accordingly, a tilt compensator device may be used to equalize the video signals and bring the high and low frequency components of the signal back into alignment.

In particular, as noted, generally, for signal components at frequencies less than or equal to about 1.0 GHz, an approximately 17 dB tilt may be applied. In another embodiment, for signals between about 1.0 GHz and about 1.2 GHz, an approximately 5 dB tilt may be applied in addition to a transmission of a flat PSD. In one embodiment, for signals between about 1.2 GHz and about 1.8 GHz, an approximately 7 dB tilt may be needed in addition to a transmission of a flat PSD.

In another embodiment, by transmitting signal components having a relatively flat PSD, the devices (e.g., amplifiers) on the network may not need additional power to impart to the signals. In another embodiment, network taps may overcome various losses by implementing a cable simulator (e.g., to correct excessive positive tilt) on high value taps, HVTs (e.g., taps having greater than about 14 dB losses). Further, the network taps may use equalizers in connection with low value taps, LVTs (e.g., taps having less than about 14 dB losses).

In various embodiments, for taps close to amplifiers, the network may implement an HVT. In another embodiment, LVT may be used as get further away from amplifiers. Further, in terms of transmit power, the LVT may need to consume more power than an HVT to amplify signal components, in part because the additional distance the signal needs to travel from the LVT. Therefore, the LVTs may use equalizers. In some embodiments, it may be possible to transmit with less power on return path for upstream communications (e.g., from a customer premise equipment to a headend) for an LVT. In some embodiments, cable simulators may attenuate signals on the high end of the frequency spectrum and may match the tilt of the cable. In another embodiment, a cable equalizer may attenuate the signal components on the low-end of the frequency spectrum.

In particular, the cable simulator may serve to attenuate components of the signal having a frequency band between approximately 492 MHz and approximately 1.2 GHz or between approximately 684 MHz and approximately 1.2 GHz. Moreover, the cable equalizer may apply an amplification of a component of the signal having a frequency band between approximately 5 MHz and approximately 492 MHz or between approximately 5 MHz and approximately 684 MHz.

In various aspects, taps (which may also be referred to as directional couplers or multi taps) may include an electronic device (e.g., a passive electronic device) used to distribute cable signals. In some embodiments, a tap may be used to redirect a part of the available signal on a line and send the signal to a customer premise equipment. In some embodiments, taps may be directional (e.g., directional couplers), which may serve to prevent unwanted signals from being fed backwards in the network.

In some embodiments, taps may include one, two, four, eight and twelve ports. Some possible tap values may include 4, 7 dB, 9 dB, 11 dB, 14 dB, 17 dB, 20 dB, 24 dB, 27 dB, 29 dB and 32 dB. In various embodiments, the taps may include an input port and an output port (or ports). Depending on tap value the tap port may tap from 3 dB to 32 dB off from the input level while reducing the output level from 3 dB to 0.7 dB. In various embodiments, for taps having a value of about 4 dB, 7 dB, or 9 dB equalizers may be used, while for taps above 11 dB, simulators may be used.

In some embodiments, for downstream communications various signal components may have a positive tilt (e.g., an excessive amplification of signal components). In some embodiments, for upstream communication the signal components may be a negative tilt. Further, the tilt may be approximately neutral for frequencies at about 684 Megahertz. In various embodiments, a network device communicating on the upstream (e.g., a cable modem) may be configured to only transmit signal components up to a certain frequency. In some aspects, embodiments of the disclosure may serve to allow cable modems to transmit signal components at lower frequency while maintaining unity gain, so that the various cable modems transmit at relatively similar power levels.

In another embodiment, for transmissions of a cable modem between about 500 MHz to about 1 GHz, there may be an approximately 17 dB loss over portions of the network. In an embodiment, for transmissions on about 1.2 GHz, there may be an approximately 22 dB loss over portions of the network. In another embodiment, for transmissions on about 1.8 GHz, there may be an approximately 30 dB loss over portions of the network. In an embodiment, for transmissions between about 1.8 GHz to about 2 GHz, there may be an approximately 12 dB loss over portions of the network. For example, if devices communicate at about 1.8 GHz, the transmission may need to be amplified by about 8 dBmV, which require a large amount of power and/or energy. Accordingly, in various embodiments of the disclosure, by transmitting with a relatively flat PSD for certain signal components, the cable modems may perform upstream transmission at about 22 dB loss, which may result in decreased performance but may serve to use less power. Moreover, by additionally using cable simulators, the total power used may be reduced, and the plant may be configured to amplify the received signal. In another embodiment, the signal may be received by various devices on the network (e.g., taps with corresponding amplifiers and/or fiber nodes such as remote PHY and/or remote MAC devices) at a lower power level and can be amplified with sufficient gain so that the signal makes it back to headend where the signal may be converted to the optical domain.

FIG. 5 shows an example diagram representing a plot of the loss in a cable network versus operational frequency, in accordance with example embodiments of the disclosure. As noted, the signals transmitted over the HFC network with frequency content at or above about 1.2 GHz may be transmitted using a relatively flat PSD. FIG. 5 shows part of the reasons why a flat PSD may serve to reduce losses in the cable using a flat PSD. In particular, FIG. 5 shows a diagram 500 of a plot of loss in units of dB on the y-axis 502 versus operational frequency in units of Hertz on the x-axis 504. Moreover, curve 506 may represent the loss of a first signal at a first PSD as the signal propagates on a section of coaxial fiber over a cable network, as shown and described in connection with FIG. 4, above. In some embodiments, curve 507 may represent the loss of a second signal at a second PSD as the signal propagates on a section of coaxial fiber over a cable network, where the second PSD is less than the first PSD. Since each bit or symbol of the second signal has more power than each bit of the first signal, at certain frequency ranges the loss of the second signal may be less than the loss of the first signal for the same frequency. Accordingly, curve 507 is shown to be flatter with respect to the loss in dB as compared with curve 506.

In particular, diagram 500 shows an example where at approximately 1 GHz the first signal and second signal may both have a loss of approximately 22 dB; however, at approximately 3 GHz the first signal may have a loss of approximately 45 dB, while the second signal may have a loss that is less than approximately 45 dB, for example, approximately 40 dB or less. As noted, this may be due to the fact that, in this particular example, the second signal may be bitloaded (e.g., differentially transmitting the number of bits that can be transmitted on given subcarriers) at frequencies greater than approximately 1 GHz and therefore the second signal does not need to be amplified as strongly as the first signal for frequencies greater than approximately 1 GHz. Further, the first signal may have a first quadrature amplitude modulation (QAM) modulation rate (for example, a 1024 QAM modulation rate), while the second signal may have a second QAM modulation rate that is less than the first QAM rate (for example, a 512 QAM modulation rate). Accordingly, since the second signal undergoes lower loss in transmission over a similar distance as compared with the first signal, the second signal may be transmitted at a lower power level and reducing the need for amplification.

In an embodiment, bitloading and flat PSD may be provided such that the signals may be transmitted over the network at higher frequencies (e.g., at or above about 1.2 GHz) without incurring excessive losses. In another embodiment, cable simulators and equalizers may be used to mitigate return power loss on upstream communications on the network. Further, the signal may be linearized by mitigating various network effects, including, but not limited to, group delays and/or microreflections on the network. In particular, echo cancellation (EC) may be used to cancel echos on the network. In particular, echo cancellation may be used at various devices on the network including, but not limited to, remote PHY and remote MAC devices, customer premise equipment, headends, and the like. In another embodiment, any suitable echo cancellation circuit may be used, for example, the echo cancellation circuit shown and described in connection with FIG. 9, below.

In another embodiment, the signals transmitted over the network may be linearized using signal processing techniques. For example, the signals may be linearized by using linear error correcting codes such as LDPC code. In another embodiment, the signal may be linearized by using a given modulation technique such as OFDM and/or OFDMA. In another embodiment, for duplex communication over the network, the network may need to operate in accordance with a given modulation technique such as NOMA, to be discussed further below in connection with FIG. 8.

In another embodiment, the portion of the signal from about 5 MHz to about 15 MHz may be dropped (e.g., filtered out) from the signal. In another embodiment, this portion of spectrum may be particularly prone to noise. Further, about half the transmit noise may originate in a drop and/or the plant.

The implementation of the one or more design rules as described above may serve to reduce the need for a high transmit power, increase the linearity of the system (e.g., thereby reducing the effect of noise), and/or reduce the effect of cable losses (e.g., by dropping the portion of the signal from about 5 MHz to about 15 MHz).

FIG. 6 shows an example schematic diagram of a plot of PSD of subcarriers used in transmissions by devices over a network, in accordance with example embodiments of the disclosure. In particular, the devices may include any suitable device, such as devices shown and described in connection with FIG. 4, above. In an embodiment, FIG. 6 shows a diagram 600 of a plot of the PSD of subcarriers used in transmissions by devices over the network, in accordance with example embodiments of the disclosure. Further diagram 600 represents the different types of modulation that may be used for components of the signals transmitted on the network having different frequency ranges. In an embodiment, diagram 600 depicts the PSD 602 plotted against frequency 604, and further shows example subcarriers 606, 608, and 610 that are modulated using a first modulation technique (for example, a first modulation technique "X," where "X" represents any known modulation technique), to transmit data and information over the network, for example, from a transmitting device such as a headend to a receiving device such as a cable modem over a cable network. In an embodiment, for transmissions over the network, various types of modulation and encoding schemes and methods can be used. For example, in an embodiment, a single carrier (SC) QAM technique may be used. In an embodiment, in transmissions including the example SC QAM transmissions, the subcarriers 606, 608, and/or 610 can have a predetermined frequency bandwidth 612. In an embodiment, the predetermined frequency bandwidth 612 can be approximately 6 MHz. In an embodiment, the subcarriers can be modulated using OFMD for transmissions over the network. For example, the subcarriers 606, 608, and/or 610 can have a bandwidth 612 of, for example, approximately 50 KHz. In an embodiment, for the SC QAM case, the subcarriers 606, 608, and/or 610 may use the same modulation scheme, for example, modulation type "X".

In various aspects, a processing component (not shown) may be configured to operate on one or more devices (e.g., device 402 which may include a CMTS, or other devices on the network) may include aspects of the functionality of the management computing entity 100, as shown and described in connection with FIGS. 1-2, above. In particular, the one or more devices may include or be in communication with one or more processing elements 205, memory 210, volatile memory 215, and may include a communication interface 220 (e.g., to communicate with between each other and with various customer premise equipment such as cable modems).

FIG. 7 shows another an example schematic diagram of a plot of the PSD of subcarriers used in transmissions by devices over the network, in accordance with example embodiments of the disclosure. In particular, the devices may include any suitable device, such as devices shown and described in connection with FIG. 4, above. In an embodiment, FIG. 7 shows another diagram 700 of a plot of the PSD of subcarriers used in transmissions by devices over the network, in accordance with example embodiments of the disclosure. In an embodiment, diagram 700 depicts the PSD 723 plotted against frequency 725, and further shows example subcarriers 722, 724, 726, 728, 730, 732, 734, 736, and 738 that are modulated using various, different modulation techniques, to transmit data and information over the network, for example, from a transmitting device to a receiving device over a cable network.

In an embodiment, for transmission over the cable network using OFDM and that make use of discreet receiving devices, the subcarriers 722, 724, 726, 728, 730, 732, 734, 736, and 738 can have different modulations types; for example, a first carrier 722 can have an "X" modulation, a second carrier 724 can have a second modulation "Y," and so on, where "X" and/or "Y" (and the like) can represent any know modulation types. Accordingly, the various subcarriers 722, 724, 726, 728, 730, 732, 734, 736, and 738, having, for example, an approximately 50 KHz bandwidth 740, can use different modulation schemes.

In various aspects, a processing component (not shown) may be further configured to operate on one or more devices (e.g., device 402 which may include a CMTS, or other devices on the network) may include aspects of the functionality of the management computing entity 100, as shown and described in connection with FIGS. 1-2, above. In particular, the one or more devices may include or be in communication with one or more processing elements 205, memory 210, volatile memory 215, and may include a communication interface 220 (e.g., to communicate with between each other and with various customer premise equipment such as cable modems).

FIG. 8 shows an example schematic diagram of a plot of power versus time or frequency for transmissions over a network, in accordance with example embodiments of the disclosure. In particular, FIG. 8 shows an example schematic diagram of a plot of power versus time or frequency for transmissions over a network by devices using a NOMA technique (e.g., over an extended spectrum on an HFC network), in accordance with example embodiments of the disclosure. Further, diagram 800 shows a plot of the power of a signal on the y-axis 802 versus frequency or time on the x-axis 804. In various embodiments, a signal may be transmitted from a transmitting device to a receiving device using any one of the resource blocks 808, 810, 812, 814, 816 and the like. In one embodiment, a given resource block (e.g., resource block 808) may correspond to a given power level range for which a transmitting device may transmit the signal to one or more receiving devices over a given frequency range or over a given time. For example, resource block 808 may indicate that the transmitting device may transmit a first signal to a receiving device at a lower power level over a first range of frequencies as compared with transmitting a second signal to a receiving device using the resource block 810 for the same frequency range. Accordingly, the receiving device may be configured to use a power demodulation technique (for example, signal interference cancellation, SIC) to determine a given received signal at a given power level from other received signals at different power levels.

In another embodiment, the devices using NOMA on the cable network may be configured to use a subset of resource blocks (e.g., resource blocks 808 and/or 812) for downstream transmissions, and may be configured to use a different subset of resource blocks (e.g., resource blocks 810 and/or 814) for upstream transmissions. In one embodiment, the frequency range for the x-axis 804 may range from approximately 1 GHz to approximately 3 GHz, as further described in connection with FIG. 10, below.

As noted, a NOMA technique may be used for transmitting and receiving signals including data and information over at least portions of the wired network, including, but not limited to, a cable network. Moreover, in one embodiment, NOMA may be used to communicate over at least portions of a wireless network (e.g., a 5G network). In various embodiments, the disclosure may enable higher spectral efficiency and throughput on wired networks, wireless networks, or both. In particular, as compared with orthogonal multiple access (OMA) techniques such as OFDM and OFDMA, NOMA may provide for one or more of the following advantages: increased spectral efficiency due to use of multiple users on the same frequency bands, increased connectivity by serving more uses simultaneously at the same time, lower latency due to simultaneous transmission in a given time interval rather than at dedicated scheduled time slots, and better quality of service (QoS) to users using flexible power control algorithms.

As used herein, orthogonality in the context of multiple-access schemes for communications systems, may refer to communications where an ideal receiver can reject strong unwanted signals from the desired signal using different basis functions to encode the signals. In particular, OMA schemes may use time-division multiple access (TDMA) and frequency-division multiple access (FDMA) channel access techniques. In TDMA, the data associated with a given user's device may be sent in non-overlapping time slots; accordingly, TDMA-based networks may need accurate timing synchronization, which may be challenging in data uplink. In FDMA implementations such as OFDMA, data associated with a given user's device may be assigned to a subset of subcarriers. Further, another OMA technique may include a code-division multiple access (CDMA) technique, which may involve coding the data associated with a given user's device in order to separate different users over the same channel.

In various embodiments, NOMA may be different than these multiple access schemes which provide orthogonal access to the users either in time, frequency, code or space. In one embodiment, in NOMA, devices communicating over the network may operate in the same frequency band and/or at the same time, but the devices and their corresponding communications may be distinguished from one another by the power levels associated with those communications. In one embodiment, a NOMA technique may implement superposition coding at a transmitting device (e.g., a headend) and a receiving device (e.g., a cable modem) may implement a successive interference cancellation (SIC) technique to separate the devices and corresponding data and may do so both in the uplink and in the downlink channels.

In an embodiment, as noted, NOMA may use the power domain to separate signals having differences in their individual power level from each other for transmission over the network. At a receiving device (e.g., a cable modem), higher power level signals may be separated out and isolated from the lower power level signal. In some embodiments, NOMA may introduce non-orthogonality in a transmitted signal either in time, frequency or code, and a total signal may be generated as a superposition of multiple signals (e.g., via a superposition coding technique) at different power levels and transmitted over the medium (e.g., coaxial cable). In one embodiment, in NOMA for downlink transmission (e.g., from the headend to a cable modem), more power is allocated to devices including user equipment (UE) located farther from the transmitting device (e.g., headend) and the least power to devices including UE that are closest to the transmitting device.

In another embodiment, the multiple signals being transmitted from a transmitting device to a receiving device may be associated with different content types (e.g., video, audio, data and the like), or may be associated with signals directed to different receiving devices (e.g., a first signal directed for a first receiving device, a second signal directed to a second receiving device, and the like). Further, as the total signal is received at a receiving device, the receiving device may perform demultiplexing based on the power difference between the multiple signals. In particular, to extract a given signal from the total signal, a technique such as SIC may be used by the receiving device. In particular, using the SIC technique, the receiving device may first decode the signal in the received transmission that is the strongest one while treating other signals in the transmission as interference and/or noise. In another embodiment, the first decoded signal may then be subtracted from the received signal and, if the decoding is determined to be greater than in quality than a predetermined threshold, the residual signal (e.g., the signal including the rest of the signals) is accurately obtained. In one embodiment, the SIC technique may be iteratively applied by a receiving device until the receiving device determines the signal that was intended for it (as opposed to determining other signals in the transmission intended for other devices on the network).

In one embodiment, the SIC or other suitable algorithms for signal extraction from a NOMA signal may be based at least in part on channel properties associated with the channel over which the transmitting device and the receiving device communicate, the received signal to noise ratio (SNR) difference associated with communications between the transmitting device and the receiving device, combinations thereof, and/or the like. In another embodiment, power sharing of the individual signals in the total signal may reduce the power allocated to each receiving device; in particular, receiving devices having comparatively high channel gains and receiving devices with comparatively low channel gains may be scheduled more frequently and may be assigned more bandwidth. In particular, the receiving device may first decode a signal it decodes that the receiving device receives from the nearest transmitting user device or the user device communicating on the strongest channel. Moreover, the last signal that the receiving device decodes may be the signal for the farthest user device or the signal from the user device on the weakest channel. Accordingly, by using NOMA the network capacity, throughput, and fairness of the network transmissions may be improved for all devices of the network.

In various embodiments, uplink implementation of NOMA may implement a different procedure as compared with downlink implementation of NOMA. In the uplink, the user devices may optimize transmit powers according to the user device's device and data characteristics (e.g., power level capability, type of data to be transmitted, etc.) and corresponding channel conditions (e.g., noisy, clear, etc.). In some embodiments, the channel conditions of the receiving device may include a sensitivity of the receiving device. In another embodiment, the sensitivity of a device may refer to the minimum magnitude of input signal required to produce a specified output signal having a specified signal-to-noise ratio, or other specified criteria. Further, the receiving device (in this case, for example, a headend) may implement SIC or a similar technique. As noted, the receiving device may first decode a signal it decodes that the receiving device receives from the nearest transmitting user device or the user device communicating on the strongest channel. Moreover, the last signal that the receiving device decodes may be the signal for the farthest user device or the signal from the user device on the weakest channel.

In various embodiments, described above included various implementations of power-domain NOMA which attains multiplexing in power domain. Unlike power-domain NOMA, code-domain NOMA may achieve multiplexing in a code domain. Like the basic CDMA systems, code-domain NOMA may share the entire available resources (time/frequency) among various transmitting devices and receiving device on a network (e.g., a wired cable network). In contrast to CDMA, code-domain NOMA may use user-device specific spreading sequences that may be either sparse sequences or may include non-orthogonal cross-correlation sequences having low correlation coefficient. In various embodiments, a code domain NOMA may implement various aspects of CDMA in conjunction with the NOMA technique. for example, non-limiting examples of code-domain NOMA that may be used in connection with CDMA and with various embodiments described herein include, but may not be limited to, low-density spreading CDMA (LDS-CDMA) low-density spreading-based OFDM (LDS-OFDM), and sparse code multiple access (SCMA).

In some embodiments, various embodiments of the disclosure may use any suitable transmission technique (e.g., NOMA) in addition to a conforming to one or more rules specified by a network specification. For example, the various embodiments of the disclosure may conform with a data over cable service interface specification (DOCSIS), including, but not limited to, a DOCSIS comprises at least one of (i) a DOCSIS 1.0, (ii) a DOCSIS 2.0, (iii) a DOCSIS 3.0, (iv) a DOCSIS 3.1, or (v) a DOCSIS 3.1 full-duplex specification. In particular, the DOCSIS specification may enable the deployment of data-over-cable systems on a nonproprietary, multivendor, interoperable basis for bidirectional transfer of Internet Protocol (IP) traffic between a cable system headend and customer equipment over an all-coaxial or HFC cable network. In another embodiment, HFC can refer to a broadband network that combines optical fiber and coaxial cable. In some embodiments, the system can include a CMTS or access controller node located at the headend, a coaxial or HFC medium, and cable modems located at the premises of the customer, in conjunction with DOCSIS-defined layers that support interoperability features. In some embodiments, the CMTS or access controller node can refer to a piece of equipment, for example, equipment located in a cable company's headend or hubsite, which can be used to provide data services, such as cable Internet or Voice over Internet Protocol (VoIP). In some embodiments, the CMTS or access controller node can include aspects of the functionality of the management computing entity 100, described above.

In various aspects, a processing component (not shown) may be further configured to operate on one or more devices (e.g., device 404 which may include a CMTS, or other devices on the network) may include aspects of the functionality of the management computing entity 100, as shown and described in connection with FIGS. 1-2, above. In particular, the one or more devices may include or be in communication with one or more processing elements 205, memory 210, volatile memory 215, and may include a communication interface 220 (e.g., to communicate with between each other and with various customer premise equipment such as cable modems).

FIG. 9 shows a diagram of an example device to be used to remove noise and/or distortions from signals transmitted by devices over the network, in accordance with example embodiments of the disclosure. In various embodiments, the device represents a device used to reduce the effects of echos at any point in the extended spectrum HFC network (e.g., between any of headend devices, cable modems, remote PHY/MAC devices, and/or the like). In an embodiment, FIG. 9 shows an input signal 902 from a cable plant (not shown), for example, an HFC cable plant. In another embodiment, the input signal 902 from the cable plant can include a co-axial bidirectional cable. Further, while the input signals 902 is described as originating from the cable plant, the input signal 902 may originate from any suitable device on the network, as described above. In an embodiment, downstream data transmission, that is between the plant and a device (for example, a cable modem), can be first described. In an embodiment the input signal 902 can propagate from the plant to an isolator 904. In an embodiment the isolator 904 can include aspects of the functionality of a tap. In an embodiment the isolator 904 can send the signal to an analog echo canceller 906. In another embodiment the analog echo canceller 906 can reduce the echoes of the signal in the analog domain. In an embodiment the analog echo canceller 906 can reduce the echo, group delay, noise amplitude, and the like, of the signal. Accordingly, after the signal passes through the analog echo canceller 906, the signal may not be as strong, and therefore, the signal can be sent through an amplifier 908. The signal can then proceed to an analog to digital converter (ADC) 910 for conversion to the digital domain. In an embodiment, the signal can proceed thereafter to a digital echo canceller 912, which can remove echos and the like in the digital domain. In an embodiment, the output of the digital echo canceller 912 can be transmitted to the device, for example, a cable modem.

In an embodiment the various transmission of the devices (for example, different modems) on the same network and/or on the same cable, can lead to the generation of echoes, micro-reflections and the like on at least portions of the network. Accordingly, when a particular device (for example, a cable modem) transmits a signal back to the cable plant, the signal can incorporate artifacts from other, for example, neighboring, devices' transmissions, in addition to artifacts from signals transmitted from the cable plant to other devices.

Accordingly, in order to reduce the effect of these artifacts on upstream transmissions from the device to the cable plant, the signal can traverse the circuit 900 in various paths. On a first path, the signal can be sent to a DSP 932 to reduce the noise. In an embodiment, the DSP 932 can remove the noise of the constellation points associated with the modulation of the signal. Then the signal can be transmitted to a digital to analog converter (DAC) 934 to modify the signal to the analog domain. The signal can then be sent to an amplifier 936 to amplify the signal. Further, the signal can be sent to a low pass filter 938 to pass through the portion of the signal with a frequency lower than a certain cutoff frequency and to attenuate the portion of the signal with frequencies higher than the cutoff frequency. In an embodiment, the low pass filter 938 can send the filtered signal into the analog echo canceller 906.

In an embodiment, due to the several devices transmitting in the same portion of the spectrum, the different signals at lower signal strengths can take on some of the same characteristics of an echo. Accordingly, as the signal has been, prior to the transmission to the echo canceller 906, been through the low pass filter 938 to remove the noise in the lower part of the spectrum, the repetitive signals from the other devices, the repetitive signals resembling echos, can be removed. Further, the signal can be passed through a notch filter 916 to include only the subcarriers of interest, while removing any extraneous portions of the signal. The signal can then be passed through an ADC 918 to convert the signal back into the digital domain. Accordingly, the analog signal can then be fed into the digital echo canceller 912. As a result of the feedback loop of this path, the signal can undergo multiple rounds of echo and noise cancellation, resulting in a more pure signal for transmission to the cable plant.

In an embodiment, the signal transmitted from the device (for example, the cable modem) to the cable plant, can traverse through a second path. In an embodiment, the signal can be sent to a second DAC 926, to convert the signal into an analog domain. Further, the signal can then be sent to a low noise amplifier (LNA) 928 in order to amplify the low noise portion of the signal. Afterwards, the signal can proceed to the low pass filter 930. The signal can then be passed through a notch filter 920 to include only the subcarriers of interest, while removing any extraneous portions of the signal. After that, the signal can be passed through an ADC 922 to convert the signal back into the digital domain. Accordingly, the analog signal can then be fed into the digital echo canceller 912. As a result of the feedback loop of this second path, the signal can undergo multiple rounds of echo and noise cancellation, resulting in a purer signal for transmission to the cable plant.

In an embodiment, the circuitry 900 can be included in the device, for example, the cable modem, or higher in the network, for example, in the remote PHY. In an embodiment, the circuitry 900 can be included in both the device, for example, the cable modem and the remote PHY device, and the like. In an embodiment, the signal, having traversed through the circuit 900 can have a resulting SNR below a given threshold, for example, below earth noise.

FIG. 10 shows a diagram representing a spectrum usage for devices on a cable network, in accordance with example embodiments of the disclosure. FIG. 10 shows diagrams of example spectra used in connection with the cable networks and devices described herein, in accordance with example embodiments of the disclosure. In particular, in diagram 1000, the frequency represented by the horizontal axis can go from approximately 5 MHz to approximately 3 GHz.

In some embodiments, diagram 1000 can represent a node-x (that is, a node having a variable number of splits) frequency band allocation scheme. In another embodiment, diagram 1000 can represent an approximately 5 MHz to approximately 204 MHz return, and an approximately 1.0 GHz to approximately 1.2 GHz forward. In another embodiment, legacy devices can use an approximately 5 MHz to approximately 85 MHz return. In some embodiments, the legacy forward portion of the spectrum in diagram 1000 can start at approximately 258 MHz.

In some embodiments, the spectrum represented in diagram 1000 can be partitioned into different portions. A legacy upstream portion 1002 can exist from approximately 5 MHz to approximately 42 MHz. This region can be used for DOCSIS 3.0 (and earlier) enabled devices using single carrier quadrature amplitude modulation (SC-QAM). In another embodiment, the legacy upstream portion 1002 can use TDMA.

In some embodiments, the portion of the spectrum from approximately 42 MHz to approximately 85 MHz can represent a portion of the spectrum 1004 implementing DOCSIS 3.1 enabled devices and using OFDMA. In some embodiments, the portion of the spectrum 1004 can be used for upstream communication.

The portion of the spectrum from approximately 85 MHz to approximately 108 MHz can represent a portion of the spectrum 1006 that may not be used for network communications, for example, because of the way some cable modems and/or other electronic devices are designed. This can have to do with various factors, for example, device roll-off considerations and other electronic device constraints.

In some embodiments, the portion of the spectrum from approximately 108 MHz to approximately 204 MHz can represent a portion of the spectrum 1008 which can be designated for full-duplex (FDX) transmissions in both the upstream and the downstream for FDX-enabled devices. In some aspects (not shown), the portion of the spectrum designated for FDX transmission can extend to approximately 684 MHz, for example, because silicon analog-to-digital converters (ADCs) may be able to handle 12-bit ADC conversion. Then the portion of the spectrum ending wherever the FDX portion ends (either approximately 204 MHz or approximately 684 MHz) to approximately 1 GHz can be reserved as a portion of the spectrum 1010 for communication comprising legacy downstream, single carrier QAM, DOCSIS 3.0 and earlier, and OFDM for DOCSIS 3.1.

In some embodiments, the portion of the spectrum 1012 over approximately 1 GHz to approximately 1.2 GHz can be used for OFDM DOCSIS 3.1, since DOCSIS 3.0 devices or earlier may not be able to tune into 1 GHz or greater portions of the spectrum.

In another embodiment, the region of the spectrum from approximately 204 MHz to approximately 258 MHz can represent a portion of the spectrum representing an amplifier diplex filter roll-off region. Then the portion of the spectrum from approximately 258 MHz to approximately 1 GHz can be reserved as a portion of the spectrum for legacy downstream communication including single carrier QAM (SC-QAM), DOCSIS 3.0 and earlier, and OFDM for DOCSIS 3.1. In some embodiments, the portion of the spectrum over approximately 1 GHz to approximately 1.2 GHz can be used for OFDM DOCSIS 3.1, since DOCSIS 3.0 devices or earlier may not be able to tune into 1 GHz or greater portions of the spectrum. In some embodiments, the portion of the spectrum 1014 over approximately 1 GHz to approximately 3.0 GHz can be used for transmissions using the NOMA technique and may implement the various design rules described herein. Further, the portion of the spectrum 1014 may be subdivided into a first portion from approximately 1 GHz to approximately 2 GHz, which may be reserved for upstream communication using the NOMA technique. Further, the portion of the spectrum 1014 may be subdivided into a second portion form approximately 2 GHz to approximately 3 GHz, which may be reserved for downstream communication using the NOMA technique. In alternative embodiments, the first portion from approximately 1 GHz to approximately 2 GHz may be used for downstream communication and the second portion from approximately 2 GHz to approximately 3 GHz may be used for upstream communication.

FIG. 11 shows a flow chart illustrating example operations that may be performed by one or more devices described in connection with the disclosed system, in accordance with various embodiments of the disclosure. At block 1102, the flow may include determining a first portion of a signal having a first frequency band, the first frequency band being greater than approximately 1.2 GHz. In particular, the determination may be performed using any suitable device, including a cable modem, a remote device (e.g., remote MAC/PHY device), a tap, and/or the like. Further, the determination may be performed using a processor in combination with memory.

At block 1104, the flow may include determining a second portion of the signal having a second frequency band, the second frequency band being less than or equal to approximately 1.2 GHz. In particular, the determination may again be performed using any suitable device, including a cable modem, a remote device (e.g., remote MAC/PHY device), a tap, and/or the like. Further, the determination may be performed using a processor in combination with memory.

At block 1106, the flow may include applying an attenuation to the first portion of the signal. In various embodiments, for signal components at frequencies less than or equal to about 1.0 GHz, an approximately 17 dB tilt may be applied. In another embodiment, for signals between about 1.0 GHz and about 1.2 GHz, an approximately 5 dB tilt may be applied in addition to a transmission of a flat PSD. In one embodiment, for signals between about 1.2 GHz and about 1.8 GHz, an approximately 7 dB tilt may be needed in addition to a transmission of a flat PSD.

At block 1108, the flow may include transmitting the first portion of the signal at a flat PSD. In an embodiment, bitloading and flat PSD may be provided such that the signals may be transmitted over the network at higher frequencies (e.g., at or above about 1.2 GHz) without incurring excessive losses. In another embodiment, the signals transmitted over the network may be linearized using signal processing techniques. For example, the signals may be linearized by using linear error correcting codes such as LDPC code. In another embodiment, the signal may be linearized by using a given modulation technique such as OFDM and/or OFDMA. In another embodiment, for duplex communication over the network, the network may operate in accordance with a given modulation technique such as NOMA. In particular, at least some frequency components of signals transmitted between devices on the network may be transmitted using a NOMA technique. In another embodiment, a portion of the signal having a spectrum between about 5 MHz to about 15 MHz may be prone to noise (e.g., noise originating from a drop and/or the plant). In another embodiment, the portion of the signal from about 5 MHz to about 15 MHz may be dropped (e.g., filtered out) from the signals transmitted over the network.

In various aspects, as noted, the processing component, the transmitting component, and/or the receiving component (not shown) may be configured to operate on one or more devices (e.g., device 402 which may include a CMTS, another network controller device further upstream on the network, and/or other devices further downstream on the network) may include aspects of the functionality of the management computing entity 100, as shown and described in connection with FIGS. 1-2, above. In particular, the processing component, the transmitting component, and/or the receiving component may be configured to be in communication with one or more processing elements 205, memory 210, volatile memory 215, and may include a communication interface 220 (e.g., to facilitate communication between devices, for example, with various customer premise equipment such as cable modems).

Moreover, the processing component, the transmitting component, and/or the receiving component (not shown) may be configured to operate on one or more devices that may be further configured to transmit data packets to customer premise equipment, which may include devices that include aspects of the functionality of the user device 110, as further shown and described in connection with FIG. 3, above. For example, customer premise equipment may include a device having a transmitter 304, a receiver 306, and/or a network interface (e.g., to communicate with an access point or other device to receive information from a fiber node or similar device). Moreover, the customer premise equipment may include a device having volatile memory 322 and/or non-volatile memory 324 in addition to a processor (e.g., to perform one or more computational tasks, such as processing received signals, etc.). Further, the customer premise equipment may include a display 316 and/or a keypad 318 (e.g., for interacting with a user or operator).

Although an example processing system has been described above, implementations of the subject matter and the functional operations described herein can be implemented in other types of digital electronic circuitry, or in computer software, firmware, or hardware, including the structures disclosed in this specification and their structural equivalents, or in combinations of one or more of them.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially-generated propagated signal, for example a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (for example multiple CDs, disks, or other storage devices).

The operations described herein can be implemented as operations performed by an information/data processing apparatus on information/data stored on one or more computer-readable storage devices or received from other sources.

The term "data processing apparatus" encompasses all kinds of apparatuses, devices, and machines for processing data, including by way of example a programmable processor, a computer, a system on a chip, or multiple ones, or combinations, of the foregoing. The apparatus can include special purpose logic circuitry, for example an FPGA (field programmable gate array) or an ASIC (application-specific integrated circuit). The apparatus can also include, in addition to hardware, code that creates an execution environment for the computer program in question, for example code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or information/data (for example one or more scripts stored in a markup language document), in a single file dedicated to the program in question, or in multiple coordinated files (for example files that store one or more modules, sub-programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, for example magnetic, magneto-optical disks, or optical disks. However, a computer need not have such devices. Devices suitable for storing computer program instructions and information/data include all forms of non-volatile memory, media and memory devices, including by way of example semiconductor memory devices, for example EPROM, EEPROM, and flash memory devices; magnetic disks, for example internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described herein can be implemented on a computer having a display device, for example a CRT (cathode ray tube) or LCD (liquid crystal display) monitor, for displaying information/data to the user and a keyboard and a pointing device, for example a mouse or a trackball, by which the user can provide input to the computer. Other kinds of devices can be used to provide for interaction with a user as well; for example, feedback provided to the user can be any form of sensory feedback, for example visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a back-end component, for example as an information/data server, or that includes a middleware component, for example an application server, or that includes a front-end component, for example a client computer having a graphical user interface or a web browser through which a user can interact with an implementation of the subject matter described herein, or any combination of one or more such back-end, middleware, or front-end components. The components of the system can be interconnected by any form or medium of digital information/data communication, for example a communication network. Examples of communication networks include a local area network ("LAN") and a wide area network ("WAN"), an inter-network (for example the Internet), and peer-to-peer networks (for example ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits information/data (for example an HTML page) to a client device (for example for purposes of displaying information/data to and receiving user input from a user interacting with the client device). Information/data generated at the client device (for example a result of the user interaction) can be received from the client device at the server.

While this specification contains many specific implementation details, these should not be construed as limitations on the scope of any embodiment or of what may be claimed, but rather as descriptions of features specific to particular embodiments. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

Many modifications and other embodiments of the disclosure set forth herein will come to mind to one skilled in the art to which these embodiments pertain having the benefit of the teachings presented in the foregoing descriptions and the associated drawings. Therefore, it is to be understood that the embodiments are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A device, comprising:
    at least one memory that stores computer-executable instructions; and
    at least one processor configured to access the at least one memory, wherein the at least one processor is configured to execute the computer-executable instructions to:
        determine a first portion of a signal having a first frequency band, the first frequency band being greater than approximately 1.2 GHz;
        determine a second portion of the signal having a second frequency band, the second frequency band being less than or equal to approximately 1.2 GHz and greater than or equal to approximately 1 GHz;
        determine a third portion of the signal having a third frequency band, the third frequency band being less than or equal to approximately 1 GHz;
        cause to apply a first tilt to the second portion of the signal;
        cause to apply a second tilt to the third portion of the signal, wherein the second tilt is greater than the first tilt; and
        cause to transmit the first portion of the signal and the second portion of the signal.

2. The device of claim 1, wherein the signal is transmitted using an orthogonal frequency division multiplexing (OFDM) multiplexing technique.

3. The device of claim 1, wherein the signal is transmitted using a non-orthogonal multiple access (NOMA) technique.

4. The device of claim 1, wherein the at least one processor is further configured to execute the computer-executable instructions to cause a reduction of one or more of an echo, a group delay, or a noise amplitude associated with the signal or one or more of an echo, a group delay, or a noise amplitude associated with the second portion of the signal.

5. The device of claim 1, wherein the at least one processor is further configured to execute the computer-executable instructions to cause to remove a fourth portion having an associated fourth frequency band from approximately 5 MHz to approximately 15 MHz wherein the first portion of the signal, the second portion of the signal, and the third portion of the signal are transmitted instead of the fourth portion of the signal.

6. The device of claim 1, wherein the at least one processor is further configured to execute the computer-executable instructions to receive the first portion of the signal, the second portion of the signal, or the third portion of the signal from at least one of a remote medium access control (MAC) device or a remote physical layer (PHY) device.

7. The device of claim 1, wherein the at least one processor is further configured to execute the computer-executable instructions to apply a linear error correcting code to the first portion of the signal or the second portion of the signal.

8. The device of claim 1, wherein the first tilt is approximately 5 dB, and wherein the second tilt is approximately 17 dB.

9. A system, comprising:
    at least one memory that stores first computer-executable instructions; and
    at least one processor configured to access the at least one memory, wherein the at least one processor is configured to execute the first computer-executable instructions to:
        determine a first portion of a signal having a first frequency band;
        determine a second portion of the signal having a second frequency band, wherein the second frequency band is lower in a frequency spectrum than the first frequency band;
        determine a third portion of the signal having a third frequency band, wherein the third frequency band is lower in the frequency spectrum than the second first frequency band;
        cause to apply a first tilt to the second portion of the signal;
        cause to apply a second tilt to the third portion of the signal, wherein the second tilt is greater than the first tilt; and cause to transmit the first portion of the signal and the second portion of the signal.

10. The system of claim 9, wherein the first tilt is approximately 5 dB, and wherein the second tilt is approximately 17 dB.

11. The system of claim 9, wherein the at least one processor is further configured to execute the computer-executable instructions to cause to apply an amplification to a fourth portion of the signal, and wherein the system includes a cable equalizer.

12. The system of claim 9, wherein the first frequency band is greater than approximately 1.2 GHz, wherein the second frequency band is less than or equal to approximately 1.2 GHz and greater than or equal to approximately 1 GHz, and wherein the third frequency band is less than or equal to approximately 1 GHz.

13. The system of claim 11, wherein the at least one processor is further configured to execute the first computer-executable instructions to transmit the signal using an OFDM multiplexing technique.

14. The system of claim 11, wherein the at least one processor is further configured to execute the computer-executable instructions to cause an echo cancellation device to reduce one or more of an echo, a group delay, or a noise amplitude associated with the signal.

15. The system of claim 11, wherein the at least one processor is further configured to execute the computer-executable instructions to cause to remove a fourth portion having an associated fourth frequency band from approximately 5 MHz to approximately 15 MHz, wherein the first portion of the signal, the second portion of the signal, and the third portion of the signal are transmitted instead of the fourth portion of the signal.

16. A method, comprising:
determining a first portion of a signal having a first frequency band;
determining a second portion of the signal having a second frequency band, wherein the second frequency band is lower in a frequency spectrum than the first frequency band;
determining a third portion of the signal having a third frequency band, wherein the third frequency band is lower in the frequency spectrum than the second first frequency band;
causing to apply a first tilt to the second portion of the signal;
causing to apply a second tilt to the third portion of the signal, wherein the second tilt is greater than the first tilt; and
causing to transmit the first portion of the signal and the second portion of the signal.

17. The method of claim 16, further comprising transmitting the signal using an OFDM multiplexing technique.

18. The method of claim 16, further comprising reducing one or more of an echo, a group delay, or a noise amplitude associated with the signal.

19. The method of claim 16, wherein the first tilt is approximately 5 dB, and wherein the second tilt is approximately 17 dB.

20. The method of claim 16, wherein the first frequency band is greater than approximately 1.2 GHz, wherein the second frequency band is less than or equal to approximately 1.2 GHz and greater than or equal to approximately 1 GHz, and wherein the third frequency band is less than or equal to approximately 1 GHz.

\* \* \* \* \*